United States Patent [19]

Davis et al.

[11] 3,786,497

[45] Jan. 15, 1974

[54] MATRIX KEYBOARD METHOD AND APPARATUS

[75] Inventors: Robert H. Davis; Jon E. Fox, both of Raleigh, N.C.

[73] Assignee: International Business Machines Corporation, Armonk, N.Y.

[22] Filed: July 31, 1972

[21] Appl. No.: 276,484

[52] U.S. Cl. ............ 340/365 S, 197/98, 340/365 C, 340/365 E

[51] Int. Cl. ............ G06f 3/02

[58] Field of Search ............ 340/365 S, 365 E, 340/365 C

[56] References Cited

UNITED STATES PATENTS

| | | | |
|---|---|---|---|
| 3,613,054 | 10/1971 | Richard | 340/365 |
| 3,675,239 | 7/1972 | Ackerman et al. | 340/365 |
| 3,653,038 | 3/1972 | Webb et al. | 340/365 |
| 3,483,553 | 12/1969 | Blankenbarker | 340/365 S |
| 3,623,082 | 11/1971 | Stein et al. | 340/365 S |
| 3,651,463 | 3/1972 | Rawson et al. | 340/365 S |
| 3,662,378 | 5/1972 | MacArthur | 340/365 S |
| 3,675,240 | 7/1972 | Anderson et al. | 340/365 S |
| 3,683,371 | 8/1972 | Holz | 340/365 S |
| 3,715,747 | 2/1973 | Hanson et al. | 340/365 C |
| 3,716,850 | 2/1973 | Fisher | 340/365 E |
| 904,008 | 11/1972 | Crouse | 340/365 C |

OTHER PUBLICATIONS

EEE, May 1969, pp. 24, 25; "Scanning Keyboard Encoder."

*Primary Examiner*—John W. Caldwell
*Assistant Examiner*—Robert J. Mooney
*Attorney*—Edward H. Duffield

[57] ABSTRACT

A digital encoding keyboard apparatus based on the use of a series of switches arrayed in a matrix configuration is disclosed, together with circuitry for scanning, detecting, shifting, preventing multiple detection, and encoding an output.

16 Claims, 21 Drawing Figures

FIG. 6A

| | | | | | | | | | | | | | | | | | | | | | | |
|---|---|---|---|---|---|---|---|---|---|---|---|---|---|---|---|---|---|---|---|---|---|---|
| PULSE 1 | 1 | 0 | 0 | 0 | 1 | 0 | 0 | 0 | 1 | 0 | 0 | 0 | 0 | 0 | 1 | 0 | 0 | 0 | 1 | 0 | 0 | 0 |
| PULSE 2 | 0 | 0 | 0 | 1 | 0 | 0 | 0 | 1 | 0 | 0 | 0 | 1 | 0 | 1 | 0 | 0 | 0 | 1 | 0 | 0 | 0 | 1 |
| ADDRESS CONTROL | 0 | 0 | 0 | 10 | 10 | 10 | 10 | 22 | 22 | 22 | 22 | 44 | 15 | 23 | 23 | 23 | 23 | 0 | 0 | 0 | 0 | 10 |
| KEY ADDRESS FEEDBACK | 0 | 0 | 0 | 10 | 10 | 10 | 10 | 22 | 22 | 22 | 22 | 44 | 15 | 23 | 23 | 23 | 23 | 0 | 0 | 0 | 0 | 10 |
| DATA BUS | | | | | | | | | | | | | | | | | | | | | | |
| CONTROL BIT | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| INPUT REGISTER | 0 | 0 | 0 | 0 | 10 | 10 | 10 | 10 | 22 | 22 | 22 | 22 | 15 | 15 | 23 | 23 | 23 | 23 | 0 | 0 | 0 | 0 |

(VARYING)

WORK CYCLE

ONE ROS SCAN

FIG. 6B

| | | | | | | | | | | | | | | | | | | | | | |
|---|---|---|---|---|---|---|---|---|---|---|---|---|---|---|---|---|---|---|---|---|---|
| PULSE 1 | 1 | 0 | 0 | 0 | 1 | 0 | 0 | 0 | 1 | 0 | 1 | 0 | 1 | 0 | 0 | 0 | 1 | 0 | 1 | 0 | 1 |
| PULSE 2 | 0 | 0 | 0 | 1 | 0 | 0 | 0 | 1 | 0 | 1 | 0 | 1 | 0 | 0 | 0 | 0 | 0 | 1 | 1 | 0 | 0 |
| ADDRESS CONTROL | 0 | 0 | 0 | 10 | 10 | 10 | 10 | 66 | 66 | 22 | 22 | 25 | 25 | 25 | 25 | 68 | 68 | 29 | 29 | 44 | 44 |
| KEY ADDRESS FEEDBACK | 0 | 0 | 0 | 10 | 10 | 10 | 10 | 22 | 22 | 22 | 22 | 25 | 25 | 25 | 25 | 29 | 29 | 29 | 29 | 44 | 44 |
| DATA BUS | | | | | | | | 66 | 66 | A | A | | | | | 68 | 68 | C | C | | |
| CONTROL BIT | 0 | 0 | 0 | 0 | 0 | 0 | 0 | 1 | 1 | 0 | 0 | 0 | 0 | 0 | 0 | 1 | 1 | 0 | 0 | 0 | 0 |
| INPUT REGISTER | 0 | 0 | 0 | 0 | 10 | 10 | 10 | 10 | 66 | 66 | 22 | 22 | 25 | 25 | 25 | 25 | 69 | 69 | 29 | 29 | 44 |
| BRANCH | 0 | 0 | 0 | 0 | 0 | 0 | 0 | 0 | 0 | 0 | 0 | 1 | 1 | 1 | 1 | 1 | 1 | 1 | 1 | 1 | 1 |

FIG. 6C

| | | | | | | | | | | | | | | | | | | | | | |
|---|---|---|---|---|---|---|---|---|---|---|---|---|---|---|---|---|---|---|---|---|---|
| PULSE 1 | 1 | 0 | 0 | 0 | 1 | 0 | 0 | 0 | 1 | 0 | 1 | 0 | 1 | 0 | 0 | 0 | 1 | 0 | 1 | 0 | 1 |
| PULSE 2 | 0 | 0 | 0 | 1 | | | | 1 | 0 | 1 | 0 | 1 | | | | 1 | 0 | 1 | 0 | 1 | 0 |
| ADDRESS CONTROL | 0 | 0 | 0 | 10 | 10 | 10 | 10 | 66 | 66 | 66 | 66 | 80 | 80 | 80 | 80 | 29 | 29 | 29 | 29 | 44 | 44 |
| KEY ADDRESS FEEDBACK | 0 | 0 | 0 | 10 | 10 | 10 | 10 | 22 | 22 | 66 | 66 | 80 | 80 | 80 | 80 | 88 | 88 | 29 | 29 | 44 | 44 |
| DATA BUS | | | | | | | | 66 | 66 | A | A | | | | | 28 | 28 | H | H | | |
| CONTROL BIT | 0 | 0 | 0 | 0 | 0 | 0 | 0 | 1 | 1 | 0 | 0 | 0 | 0 | 0 | 0 | 1 | 1 | 0 | 0 | 0 | 0 |
| INPUT REGISTER | 0 | 0 | 0 | 0 | 10 | 10 | 10 | 10 | 66 | 66 | 66 | 66 | 80 | 80 | 80 | 80 | 29 | 29 | 29 | 29 | 44 |
| BRANCH | 0 | 0 | 0 | 0 | 0 | 0 | 0 | 0 | 0 | 0 | 0 | 1 | 1 | 1 | 1 | 1 | 1 | 1 | 1 | 1 | 1 |

MATRIX KEYBOARD METHOD AND APPARATUS

BACKGROUND OF THE INVENTION

This invention relates generally to keyboard signal encoding systems and more particularly to digital data communication devices in which encoded permutations of digital data bits are the desired output of the keyboard.

PRIOR ART

While numerous digital data keyboard devices have been constructed prior to this invention, all have suffered from one or more shortcomings. For example, a number of prior devices of this type have utilized electrical key switches which are subject to all of the ills associated with electrical contacts and mechanical actuating devices. Contact bounce, pitting, corrosion, friction and wear in the mechanical parts, annoying intermittent failures, and difficult repair or replacement operations have characterized this type of device.

In addition, normal keyboard functions such as key interlock, shift, and key roll (the prevention of erroneous output caused by near-simultaneous depression of multiple keys) have previously been provided by traditional mechanical linkages and connection systems which are slow, inflexible, and a continual source of potential failure.

Additionally, while prior devices have achieved a measure of success in generating the desired digital codes, they have, because of their relatively inflexible mechanical design, been ill-suited for adaptation to a variety of coding formats and schemes without laborious rewiring and other expensive changeoever techniques.

Specific electronic keyboards have been built around various types of electronic key transducers, but all are relatively complex and expensive and/or require sophisticated signal waveform generators and sensors to pulse the various transducers.

Additionally, while previous keyboards have utilized scanning apparatus to apply signals to a matrix array of transducers, the apparatus so used has not provided a simultaneous encoding function used to provide an output code to identify the point in the matrix which is activated in a way which makes code formats easily changeable.

Similarly, while a limited degree of key roll has been previously provided, such provision has not been made for a desirably greater number of keys, such as three or more as the mechanical and electrical devices used have generally been incapable of this extended function, especially in a simple and inexpensive way.

OBJECTS OF THE INVENTION

In view of the above and other difficulties in the prior art, it is an object of this invention to increase reliability and reduce maintenance in an improved keyboard data entry system.

It is also an object of this invention to provide greater flexibility in changing code formats and schemes in an improved keyboard coding system.

It is further an object of the present invention to improve over known capacitive keying systems by adapting a matrix configuration having shared sensing amplifiers to capacitive transducers.

It is also an object of this invention to provide key roll functions in an improved and simplified way.

It is another object of this invention to improve the code generation technique used in a coded data system.

SUMMARY OF THE INVENTION

The foregoing and other objects of this invention are achieved by addressing each key in a capacitive key matrix, applying digital electrical drive signals to each such key, and sensing whether an output signal from such key exists using an improved sense amplifier which is the subject of a copending application, Ser. No. 203,390, now defensive publication T904,008. A scanner is utilized to address each key with a drive signal, to gate appropriate sensing amplifiers and, in one embodiment, to output an address code for each actuated key.

BRIEF DESCRIPTION OF THE DRAWINGS

FIG. 6A illustrates the basic address generation cycle produced by the apparatus of FIG. 5.

FIG. 6B illustrates a modification of the basic generation cycle of FIG. 6A.

FIG. 6C illustrates another modification of the basic generation cycle of FIG. 6A.

With reference to FIG. 1, the overall system and operation of the present keyboard will be discussed in general terms and, as several embodiments of the invention will be discussed later and many variations thereof are possible, much of the detail with regard to specific components embodied in FIG. 1 will be omitted from this general discussion to be described more fully under the descriptions of the specific embodiments which will follow.

Referring now to FIG. 1, a capacitive key matrix 1 is illustrated in the upper left-hand corner. The electronics of the present system are based on a key transducer which operates by varying the amount of capacitive coupling between two coplanar plates by the movement of a coupling plate in a plane parallel to the two coplanar plates. In operation, one of the coplanar plates is provided with a source of digital pulses, while the other is connected to a special low impedance current integrating amplifier for detecting the presence of a signal which may be selectively coupled from one coplanar plate to the other, due to the action of the key transducer. The specific key transducer contemplated in these terms is fully described and discussed in copending application Ser. No. 183,583 which, for purposes of full description of a transducer suitable for use in this invention, is made a part hereof. Similarly, the low impedance current integrating amplifier 2, mentioned above, is the subject of another application, Ser. No. 203,390, now defensive publication T904,008, which, for purposes of describing in detail the design and construction of such an amplifier, is made a part hereof.

Figure 1:
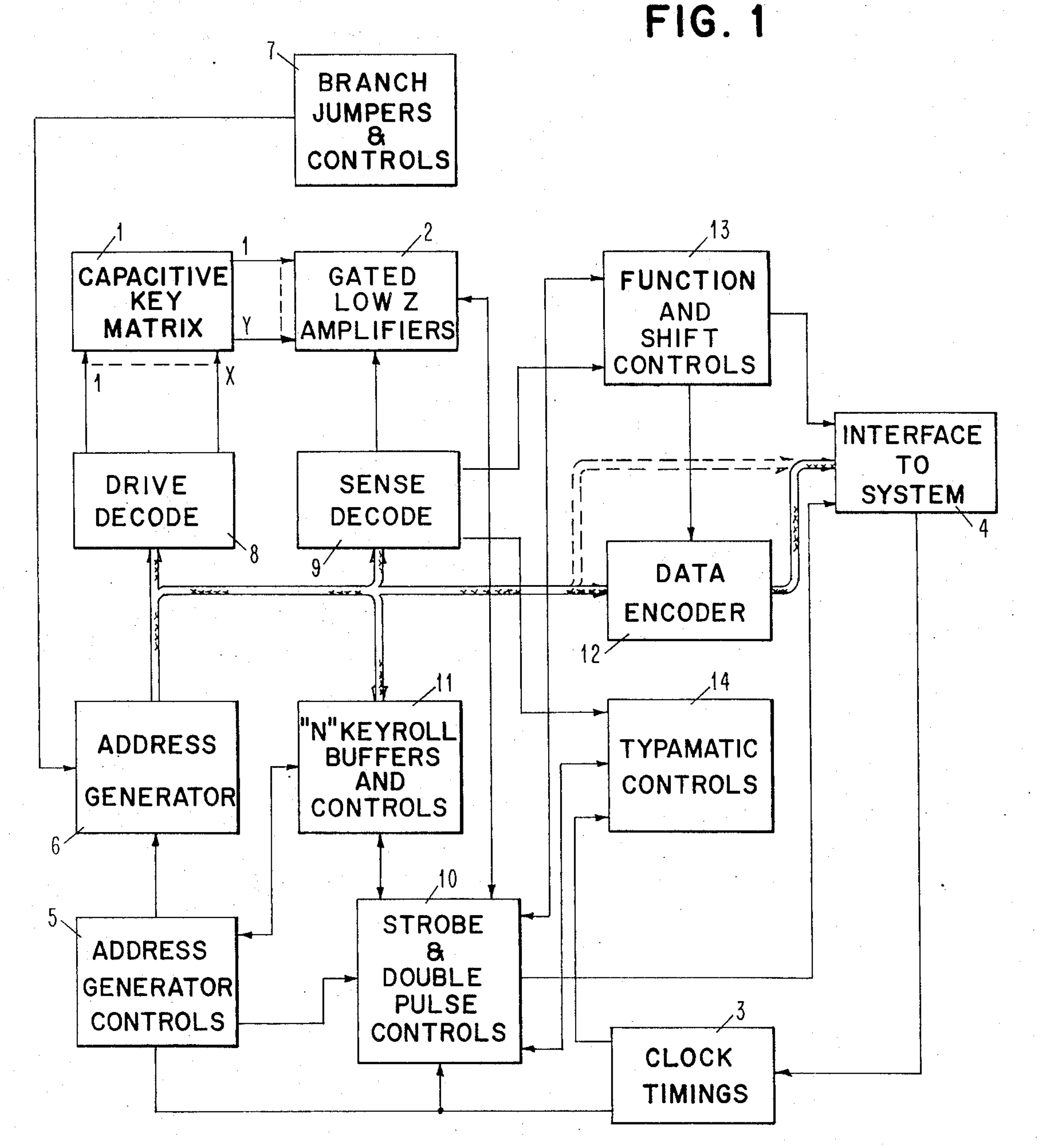
FIG. 1 is a functional schematic diagram of the generic system of the subject invention and illustrates in block form the inter-relationship and arrangement of the various major elements which comprise the keyboard.

It is, of course, obvious that ordinary electrical switches or any of a variety of electrical and/or electronic switching devices could be utilized instead of the capacitive key transducers discussed as being useful in an embodiment of this invention.

Examples of such alternative switches and key transducers are legion, but those which exhibit long life, small size and mechanical simplicity are preferred. The so-called "Hall-effect" semiconductor switches, elastic diaphragm switches, magnetic reed switches and many other types are suitable for application to the key matrix as crosspoint actuators or couplers. Any transducer capable of providing a path for the transmission of a sensible signal from the clock to the sense amplifier will, in general, suffice.

This system, however, utilizes capacitive transducers for their low profile and small physical size combined with their ease of manufacture and assembly. The coplanar capacitive pads are, in practice, formed using standard printed circuit techniques on an insulative circuit board. The pads thus formed are then overcoated with a protective and electrically insulative layer, and the coupling capacitive plate, which is incorporated in a capacitive key transducer described in application. Ser. No. 183,583, is then placed in physical proximity over the area on the circuit board occupied by a given pair of capacitive pads. No further electrical connection between the transducer and the capacitive pads is required. All signals into and out of the various capacitive pads can be handled on the circuit board without wiring being attached to the key transducers. For a further reduction of complexity, the various capacitive key pads are arranged in a matrix configuration with various input capacitive pads being connected in columns, for example, with the output capacitive pads being connected, for example, in rows so that the actuation of a given capacitive coupling key transducer will couple a signal from a given column to a given row. It is obvious that the particular designation of column row connections may be altered at will without affecting the desired operation.

In practice, the capacitive key transducers are arranged so that a signal is normally coupled from each column to each row by each key transducer, which, upon actuation, breaks the coupling and causes the loss of an output signal This results in an easier mode of detection and enables simplification of the sensing circuitry and logic. It is obvious, of course, that either the presence or the absence of coupling between any two given capacitive pads can be taken as the meaningful event significant of an actuation of the key located at that particular crosspoint. It is merely a matter of choice in engineering design which dictates whether one chooses to use the presence or the absence of the signal. As indicated, the choice in this instance has been to detect the absence of a signal at a given crosspoint as indicative of the key depression and the key transducer described in Ser. No. 183,583 operates in this fashion so that upon depression of the key, the capacitive coupling plate is moved rapidly away from the two coplanar capacitive plates and the signal level which is coupled therebetween is thereby greatly reduced.

The use of a matrix configuration for the capacitive plates on a circuit board makes possible the sharing of drive and sense lines by more than one key. This matrix may be described, in general, by the number of keys on a keyboard equals N which in turn is equal to $X \times Y$ where X is, arbitrarily, the number of columns in the matrix and Y is, arbitrarily, the number of rows in a matrix, each key defining a given intersection between a row and a column. In a typical configuration for a 64-key keyboard, 16 columns or drive lines could be provided with four sensing rows and amplifiers to sense the coupling or uncoupling of a signal from any of the drive lines to the sense lines. In such an embodiment, each driving line would go to four separate keys at the intersections of the four rows and each amplifier would detect the presence or absence of a signal appearing in a row and would thus be serving 16 separate keys or intersections, only one of which would be pulsed by a drive line at any given time. Circuitry and apparatus for providing this mode of operation will be discussed in greater detail later, but for the present, it may be understood that by selectively applying pulses to a given drive line and by gating an appropriate amplifier to sense the presence or absence of a signal on its row, it becomes possible to sample each key in a scanning arrangement.

In an embodiment to be described in greater detail later, each key transducer has an arbitrary binary address which is unique. The drive pulse gating and amplifier gating signals come from a scanner which operates as a binary address generator. A portion of each binary address from the generator is decoded to provide signals to connect a source of clock pulses to a given drive line and another portion of binary address is decoded to provide signals for gating a specific amplifier to detect the presence or absence of signals on that row which would be produced if a given key located on the driven line is depressed. If the key actuator is of the normally open type, then the presence of an output signal detected by a given amplifier would indicate that the key has been depressed. The opposite case is true for a normally closed actuator. The information thus derived as to the depression or non-depression of a key is then used to control the scanner, generator output data, strobe signals, and the remaining logic functions which will be discussed below.

Continuing now with a brief description of the elements illustrated in FIG. 1, the logic and apparatus to be discussed below requires a source of timing pulses or signals for the coordination of various control functions. These signals come in the form of electrical voltage pulses produced or derived from a basic oscillator or multivibrator operating at the desired frequencies in clock 3. The original source of timing pulses for clock 3 may be either from an oscillator within the clock on the keyboard or from the using system which interfaces at 4. The frequency of control pulses produced by clock 3 determines the rate at which the various keys in capacitive matrix 1 are scanned. If the control pulses are stopped, then effectually, the logic is frozen or locked at that point. Thus, stopping of control pulses can be used to either electrically lock out the keyboard or to hold a data character in place thus providing, in effect, for one character of buffering. The clock is used to generate a series of non-overlapping pulses that are sequentially and repetatively displaced in time. This is done by using the basic clock frequency and counting it down with several stages of triggers. The timing pulses are generated by decoding the status of the triggers. The number of timing pulses required by the logic determines the size of the count down string. The basic frequency utilized in an embodiment of the invention is 200 Khz produced by a multivibrator and broken down into longer time period clock signals by the counting and decoding operation described to give other clock signals having typical frequencies 50 Khz, 25 Khz, and lower. In one embodiment, 32 clock pulses are needed for a complete code generation, detection and output cycle for one key as will be discussed in greater detail below.

The pulses from clock 3 are applied to scanner controls in block 5 which determine the gating and incrementing of the scanner in block 6. The scanner provides a series of binary addresses which may be generated in at least two different ways as will be discussed later. Its primary function is to provide binary addresses to be decoded for driving the various columns and for sensing the various rows, although it may also be used to generate a binary data address at the same time. Branch jumpers and controls in block 7 determine which addresses will be generated in what sequence by the address generator 6. The personality of the keyboard can be changed by jumpers that are added in the branch control 7 so that, or example, if a given address sequence might be 1, 2, 3, 4, with no branch jumpers present, jumpers could provide a sequence of 1, 2, 3, 6 so that the fourth key address generated and scanned would have an address of 4 normally associated but which would be changed to 6 when the jumpers are added. The addresses are changed in the address generator by adding a binary number to the key address that is designated as under branch control. The binary number to be added is that which is indicated by the jumper. For the example just described, the fourth key in the address sequence is under branch control and the branch number to be added is 2. This branching capability enables changes to be made in the sequence in which addresses are produced in the address generator which would enable, for example, the more frequent sampling of specified highly used keys or a change of data associated with the given key in the case where the binary address generated in address generator 6 is used for the dual purpose of providing the drive and sense decodes as well as representing a unique binary address or data character for the specific key thus identified.

To illustrate: an 8 bit binary address from address generator 6 will be presumed as a code indicative of the identity of a particular key which will be outputted to the using system, is one embodiment of the invention, if that specific key is actually depressed. The same binary address thus provided is also utilized to provide the driving control and sensing control signals. The high order bits are decoded to provide gating control signals for the amplifiers in gated amplifiers 2 and the low order bits are decoded to provide gating control signals for the drive signals from clock 3 applied by decoder 8. By this means, separate counters or separate scanners for the rows and columns in capacitive matrix 1 are eliminated as is a separate encoder, in one embodiment of the invention, for encoding the identity of a key with data for output. The sense decoder 9 operates on the high order bits in the address generated in address generator 6 to gate one of the plurality of amplifiers in block 2 to sense whether signals appear in a given row in capacitive key matrix 1. Thus, at a given address, only one drive line in the drive decoder 8 would be activated to apply pulses from clock 3 to a given column in capacitive matrix 1 and only one amplifier in the bank of gated amplifiers 2 would be activated to sense the presence of signals (or the absence thereof) in a given row of capacitive matrix 1, thus uniquely identifying a single crosspoint which may or may not be actuated at that point in time at which the specific key thus designated is scanned.

Figures 4, 5:
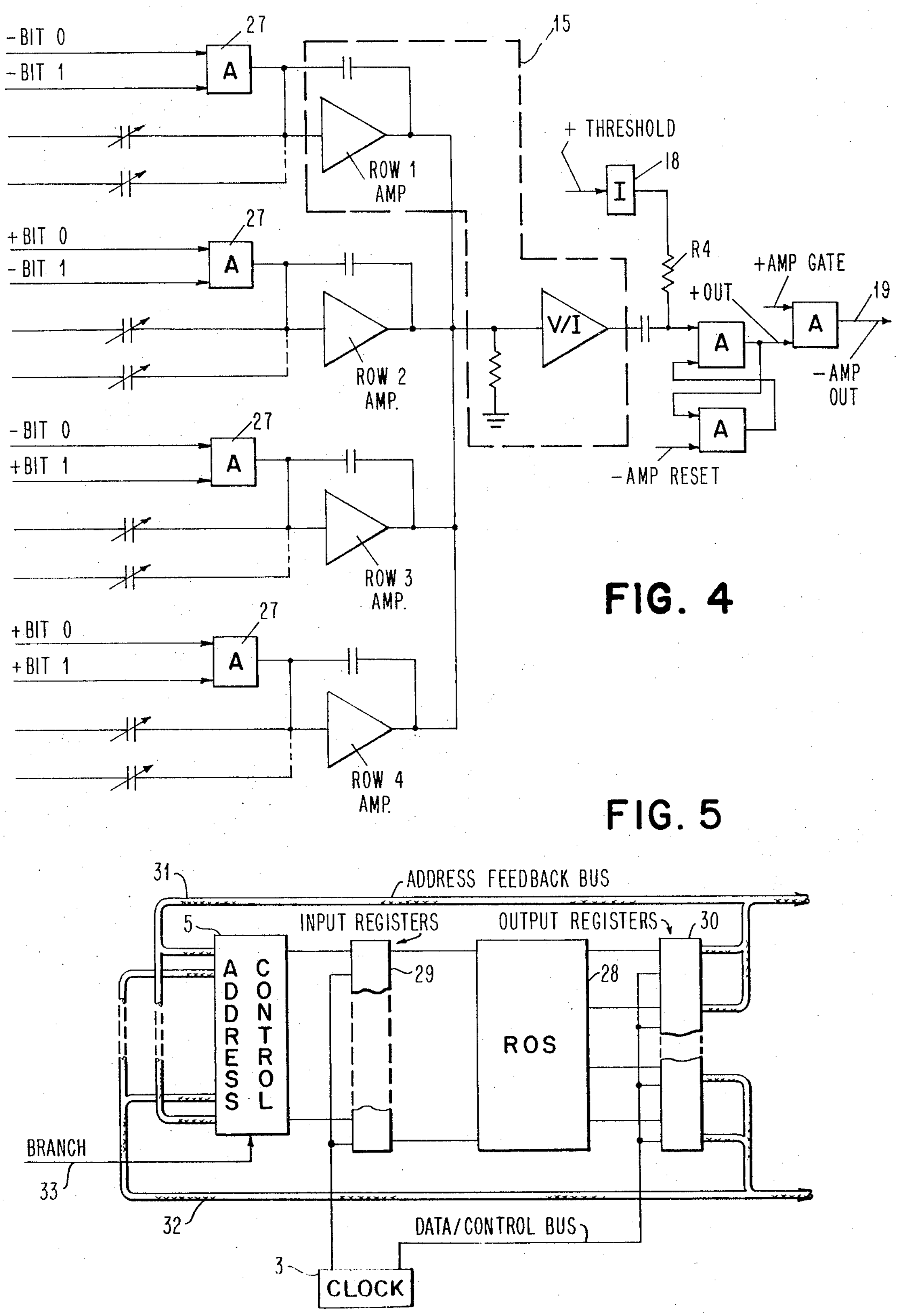
FIG. 4 illustrates the sensing amplifiers and gating utilized in the invention to provide an input to the double pulse checking circuit of FIG. 2E and is the primary detection amplifier utilized.
FIG. 5 illustrates, in schematic form, the basic self-addressing scheme of using a read-only storage device as an address generator for scanning the key matrix.

Assuming that a given key is scanned and happens to be depressed, the pulse from clock 3 applied over the appropriate drive line from the drive decoder 8 will couple through one of the capacitive key pads in proportion to the amount of capacitve coupling which exits which, in turn, is a function of whether or not the capacitive actuating key is depressed. The amplifiers which are illustrated in FIG. 4 and are discussed in greater detail later, are in two stages. The first stage of amplifiers 2 reproduces the drive pulse in proportion to the amount of coupling which exists at the intersection of the row and column. The second stage of the amplifier is utilized to provide an output to be compared against a given threshold to determine whether or not the pulse thus produced is valid in that it falls above or below a given cut off point at which sensed pulses are separated from noise in the system. As will be discussed later, a physical amount of hysteresis can be obtained by varying this sensing threshold level on the second stage of amplifiers 2, such as by switching a different bias to the input of this stage, which enables the electronic logic to provide protection against bounce and other circuit and signal variations.

Assuming that the key was depressed and that a valid pulse was recognized as being above the acceptance threshold, the digital signal, which is essentially the reconstruction of the clock pulses from clock 3, is sent to the strobe and double pulse controls 10. As will be discussed in greater detail later, the double pulse control is used for noise protection. Each key has two pulses displaced in time sent to it from clock 3 and the digital amplifier output from amplifier 2 is stored for each potentially valid pulse received and the stored pulse is compared against the succeeding pulse. If the pulse levels are the same, they are considered valid. This indicates either that the key is opened or, depending on the logic system used, closed. If the pulses are not the same, the results are ignored as being produced by noise or some disturbance in the line, inaccurate sensing or other sources.

Presuming that the pulses from a given key are determined to be valid by the strobe and double pulse controls 10, an indication is given to the key roll buffers and controls 11 which store the addresses of keys as valid depressions of keys are detected so that it can be determined whether key depression information for that particular key has already been sent out of the system. The buffers in the key roll buffer and control segment 11 are searched each time a valid key depression is detected and each time a key is addressed. If a key is not depressed, its address from address generator 6 is compared against the content of the buffer 11. If its address is found in the buffer at this time, it is removed from the buffer. If the key is depressed and its address from address generator 6 is not found in buffer 11, then the address is placed in the buffer and the information or address is sent to the strobe controls for output from the system. This will result in a strobe pulse being sent to the system to output the identified address or to encode the address with specific data for output as will be discussed. If the key is depressed and the address is found in the buffer, it is indicative that the data for that key has already been sent and nothing is done. This is so that multiple sending of addresses for a given key will not occur as the result of a single key depression unless specific typamatic controls, to be discussed later, take over and output multiple indications for that key. The number of stages of buffering in the key roll buffers and controls 11 determines the amount of key roll provided by the system. Key roll can be defined as the function of preventing interference in outgoing data when a second key is depressed after a first key has already been depressed and is still held down. If three stages of buffering are provided, then the keyboard would have a four keyroll capability so that up to four keys could be depressed and held down and the data for those keys would be accurately read out only once for each key as will be discussed in greater detail below.

Prior to sending a strobe signal from block 10, the data encoder 12 will encode a data character associated with specific key address coming from the address generator 6, unless it is desired, as indicated by the dotted cable lines in FIG. 1, to output the generated address as a data character itself. The data character, whether generated by the data encoder 12 or whether coming unchanged from the address generator 6 is outputted to the using system through the interface 4. Interface 4 consists of proper gating and voltage level drivers to serve whatever using system or logic is desired. The interface typically consists of lines for the data bits and a strobe line which indicates when the data bits are true. The strobe line will be raised once for each key depression of a data key. Special lines such as Shift or Reset are part of the interface as well as the voltages and ground required by the keyboard.

Sense decoder 9, which decodes the higher bits in the address generated by generator 6 for the gating of amplifiers 2, is also used to detect the presence of a special bit in the binary address from generator 6 which is used to indicate special function keys such as typamatic keys that give repeated output if they are held down beyond a sufficient timeout period. Another example of a special function key would be a shift key. The function and shift controls in block 13 take note of the fact that a specific type of special function key is depressed, such as a shift key, to place the data encoder 12 in its upper case mode to output data for an upper case character. The shift line from function and shift controls 13 to data encoder 12 is latched in this condition and held for a full scan period (1 address generation time) so that the upper case will be activated in the event tbat the key is depressed and is detected as validly depressed so that when the strobe signal appears an upper case character code will be outputted. A typical application would also include a shift lock key, in which case the shift line would stay activated until it is reset by a depression or the release of a shift lock key. Other special function lines, such as the typamatic or a reset key, are held activated only as long as the key is held down.

The typamatic controls in block 14 provide repetitive strobe pulses if a valid key depression is detected for selected keys that are provided with a special bit in their address when they are held depressed for a minimum timeout period determined by circuitry within block 14. The identification of these keys by the special bit in their address is provided by the address decoder 9 which is connected to block 14 to signal that a special key has been detected. The clock timings from clock 3 provide both the timeout delay and the repetitive strobe signals as indicated by the interconnections between blocks 10, 14 and 3.

This completes a basic description of the overall system as illustrated in FIG. 1. Because the basic operation of this system functions as a result of binary address codes, the logic utilized can either be standard TTL or VTL transistor circuits or they may be implemented using the large bit capacity of large scale integration technology which currently exists. Referring briefly to FIG. 1, the functions of blocks 6, 7, 12 and 9 can all be implemented in a standard binary read-only storage memory as will be discussed in greater detail below. The advantages of this implementation are an increase in function and flexibility of personalizing each function for each key. Similarly, while the foregoing brief description has contemplated full function implementation, it is possible to eliminate many of the characteristics provided in the event they are not required or desired by the user. The branch jumpers and controls 7 may be eliminated with the address generator 6 being an ordinary binary counter to provide individual binary addresses in sequence. Likewise, the N key roll buffers and controls 11 may be eliminated and the address generator 6 can be interconnected with the strobe and double pulse controls 10 so that it can be stopped when a valid key depression is detected. The function and shift and typamatic controls 13 and 14 can also be eliminated if they are not required and the data encode segment 12 can be removed in the event that the binary address from the counter which would be used in address generator 6 is desired as the output code. In such a case, the order in which the various keys are connected to drive and sense amplifier lines in the matrix 1 would determine what the scan code (binary address) would be for a given key so that, by selective wiring, the code personalization of a given keyboar can be carried out on the circuit board level.

Beginning now with a more detailed description of some of the major functions of the blocks illustrated in FIG. 1, attention is directed to FIGS. 2A through 2E with relation to the construction of the gated amplifiers 2 and the strobe and double pulse controls 10.

Figure 2A:
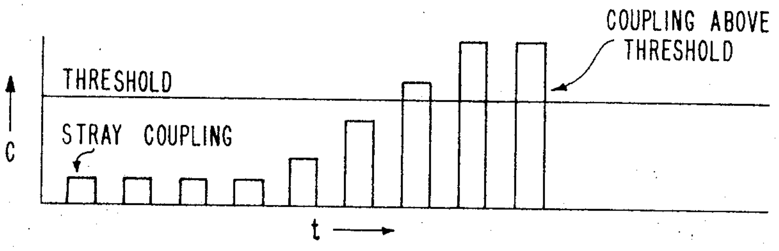
FIG. 2A illustrates in graphic form the basic signal sensing threshold concept utilized in the invention.

As previously mentioned, a double pulse and variable threshold detection scheme is utilized in the embodiments of this invention to eliminate the susceptability of the system to injected noise and variations of the coupling and sensitivity for a digital pulse variable capacity threshold detecting amplifier system. In general, a detection scheme which depends on the amount of capacitive coupling of a digital pulse through a variable capacitor as an input to a threshold detecting amplifier offers advantages of simplicity and low cost particularly in applications such as key detection for keyboards. FIG. 2A illustrates the basic concept of this scheme in a typical application in which the amount of capacitive coupling would vary with each transducer within the capacitive matrix. As illustrated in FIG. 2A, with the amount of capacitance C illustrated on the ordinate, when the amount of capacitive coupling is great enough, the voltage pulses coupled through the capacitor and reconstructed by the amplifiers as discussed in application Ser. No. 203,390, now defensive publication T904,008 would exceed a specified voltage threshold. At this point, the electronics used can detect the event as a "key closure" (when normally open actuating types of keys are used) or it can detect the absence of this signal as it falls below the threshold as a "key closure" when normally closed type actuators are used, as discussed in Ser. No. 183,583.

Figure 2B:
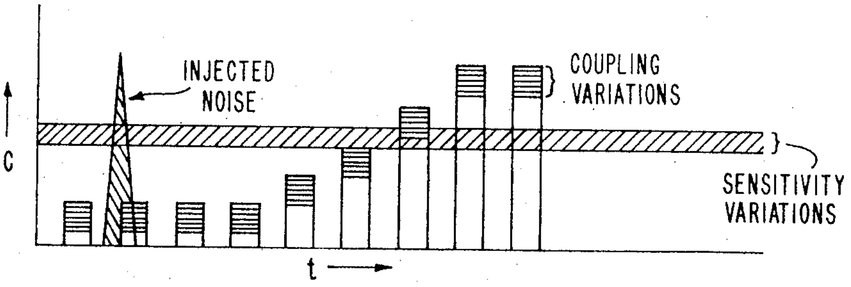
FIG. 2B illustrates the effects of noise and electrical disturbances on the sensing scheme of FIG. 2A and indicates how these problems are overcome by a double pulse sensing technique.

When this type of approach is used, however, there are exposures and sensitivities to noise as illustrated in FIG. 2B which would be detected as though normal coupling were present, thus giving a false output to the logic. This can be overcome by relying on a double pulse noise suppression scheme which overcomes the uncertainties which can be produced by injected noise, coupling variations and sensitivity variations in the amplifiers illustrated schematically in FIG. 2B.

Figure 2C:
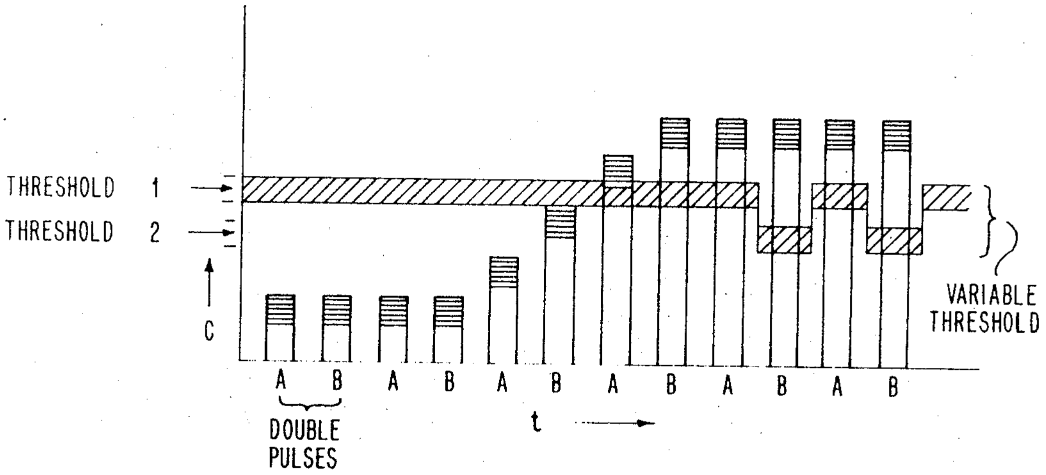
FIG. 2C illustrates the concept of utilizing a variable threshold sensing level for alternate pulses and is intended to augment FIGS. 3A and 3B.

FIG. 2C illustrates sets of paired or double pulses A and B utilized in this sensing technique. The logic to be discussed below stores the status of a recognized valid pulse produced when the A pulse is detected and then compares this stored level with the B pulse when it is detected. The comparison results in an immunity to noise since, in general, noise and external variations occur singly and not in paired pulses. If the two pulses sensed are the same, then the results of key depression are presumed to be a valid key depression. If the pulses do not match, such as when one of them is caused by a noise spike which is only a single pulse without a pulse to compare against, the results are ignored. This scheme operates satisfactorily as long as the distance between valid signal pulses is greater than the duration of any noise spike and whatever saturation effects which a spike may have on the amplifier, and the repetition rate of valid pulses is greater than the frequency of occurrence of injected noise spikes. Under such conditions, immunity to injected noise spikes can be guaranteed. In practice, the most common type of noise spike may be either electrostatic discharge or a 60 Hz induced AC signal. It has been found advantageous to use an A and B pulse repetition rate of 0.1 Mhz as provided by basic clock 3 since this effectively overcomes the most common types of injected noise. However, suitable pulse repetition and duration rates could be chosen to suit a specific environment in which the characteristics of injected noise are first measured.

Another potential problem inherent with digital thresold detecting schemes lies in the variations that can occur as the result of slight variations in the specific transducers or actuators and in the sensing circuitry. These variations are illustrated in FIG. 2C as coupling or sensitivity variations and are caused by the actuator of a given key not changing capacitance in a sufficiently linear fashion or by power supply and component variations. When the various bands of variation overlap as illustrated in FIG. 2C, it is possible to get false outputs as the coupling value approaches the threshold region. This problem can be avoided by providing a variable threshold capability in the sense amplifier illustrated in FIG. 2D. The effect is shown in FIG. 2C where the amount of amplifier threshold variation is shown to be greater than the coupling and sensitivity variations so that false outputs can be eliminated.

Figure 2D:
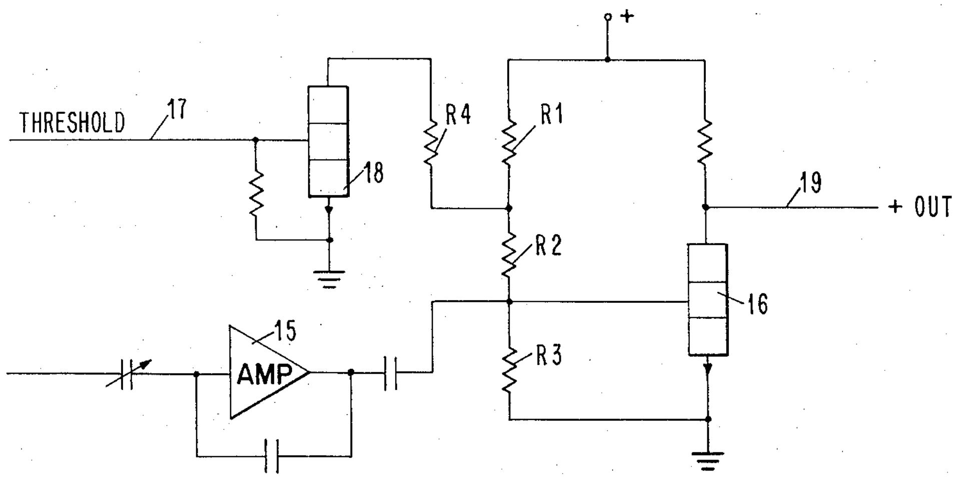
FIG. 2D illustrates a circuit for providing a variable threshold level as used in the invention.

FIG. 2D illustrates the circuitry for producing the variable threshold and operates as follows: amplifier 15, which is of the type discussed in application Ser. No. 203,390, now defensive publication T904,008, provides a reconstruction of the original negative pulse input clock signal which is proportional to the amount of coupling that exists between the input line and the output line in the matrix 1 as determined by an individual capacitive coupling key such as discussed in application Ser. No. 183,583. This amplified pulse is coupled into the base of transistor 16. Assuming that the threshold line 17 is negative (to set a level for a negative drive pulse to be compared against), transistor 18 will be turned off and the bias of transistor 16 will be determined by the resistances R1, R2, and R3 which can be chosen to suit the specific type of transistor 16 operating conditions. This bias level requires a pulse of certain negative magnitude from the output of amplifier 15 in order to turn off transistor 16 and give a positive output signal on line 19. The specific output voltage from amplifier 15 at which this occurs is the first threshold of the circuit as illustrated in FIG. 2C.

If threshold line 17 goes positive, as it does once for every sensing operation, transistor 18 will conduct and the bias of transistor 16 will be determined by resistors R1, R2, R3 and R4. This bias will be closer to the (negative) cutoff level of transistor 16 so that a smaller magnitude pulse from amplifier 15 is required to turn off transistor 16 and obtain a positive output on line 19. Therefore, the sensitivity of the circuit has been increased by raising the level appearing on threshold line 17 which results in lowering the threshold level to threshold 2 illustrated in FIG. 2C with the concomitant result previously described. The threshold on line 17 is raised by applying a voltage derived from clock 3 by the strobe control 10.

Figure 2E:
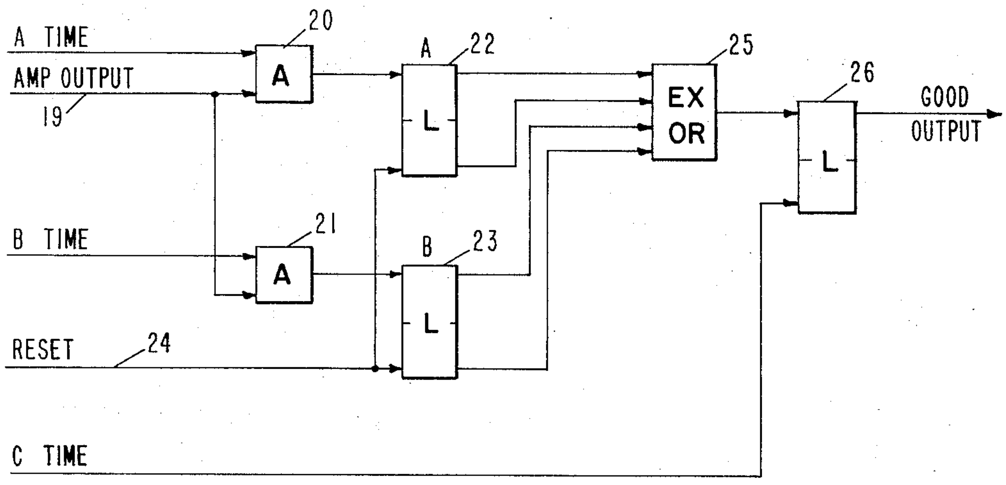
FIG. 2E illustrates a double pulse sensing circuit as utilized in the invention.

The validation circuit for determining whether pulses passed by the variable threshold circuit just described are, in fact, valid signal pulses is illustrated in FIG. 2E. Signals coming on line 19 from the variable threshold amplifier in FIG. 2D are applied, together with enabling clock pulses at the A pulse time and B pulse time to AND gates 20 and 21. The A and B pulse times and the enabling signals applied to AND gates 20 and 21 are supplied by lines not shown from basic clock 3. If either of the AND gates 20 or 21 receives a signal on line 19 together with a clock timing signal from clock 3, it will produce an output level from the AND gate until it is reset by a signal on line 24 from the clock 3 which is provided after each B pulse. The outputs from latches 22 and 23 are Exclusively OR'ed in Exclusive OR 25 where either the presence of both latches being set or both being upset is considered a "good input" meaning that a key has been validly depressed or is validly not depressed. Output latch 26 holds the result of the comparison in the Exclusive OR 25 until just before the next A pulse time when the latch is cancelled by a signal C from clock 3.

Returning now to FIG. 2C, the utilization of the double pulse noise suppression and variable threshold techniques in combination with each other are illustrated. The initial threshold level is kept high until two pulses (A and B) are detected as being above the threshold. From that time on, the threshold is kept high for the A pulse but low for the B pulse and no action is taken unless both pulse outputs are above their thresholds. This means, that on a true release of the key actuator, the coupling capacitance must drop by at least some discrete amount in order for a true release of the key to be detected following a true depression being detected by the double pulse checking scheme outlined above. This gives an electrical hysteresis effect which separates the "make" and "break" points of the capacitive coupling switch which can be equated to a mechanical hysteresis in the actuator mechanism of the coupling itself.

Figure 3A:
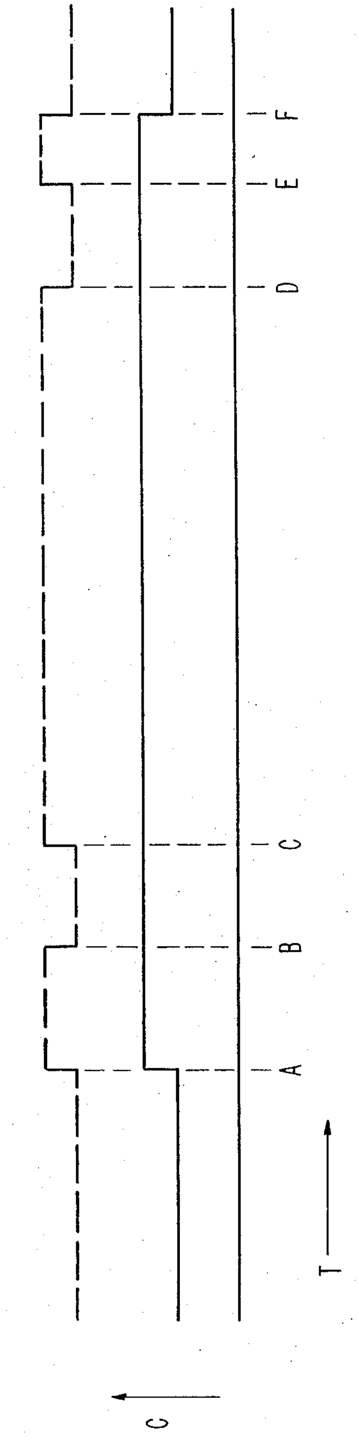
FIG. 3A illustrates in graphical form how the absence of a means for detecting a true key release and distinguishing it from noise and electrical fluctuations can lead to erroneous sensing by the double pulse technique of FIG. 2B.
Figure 3B:
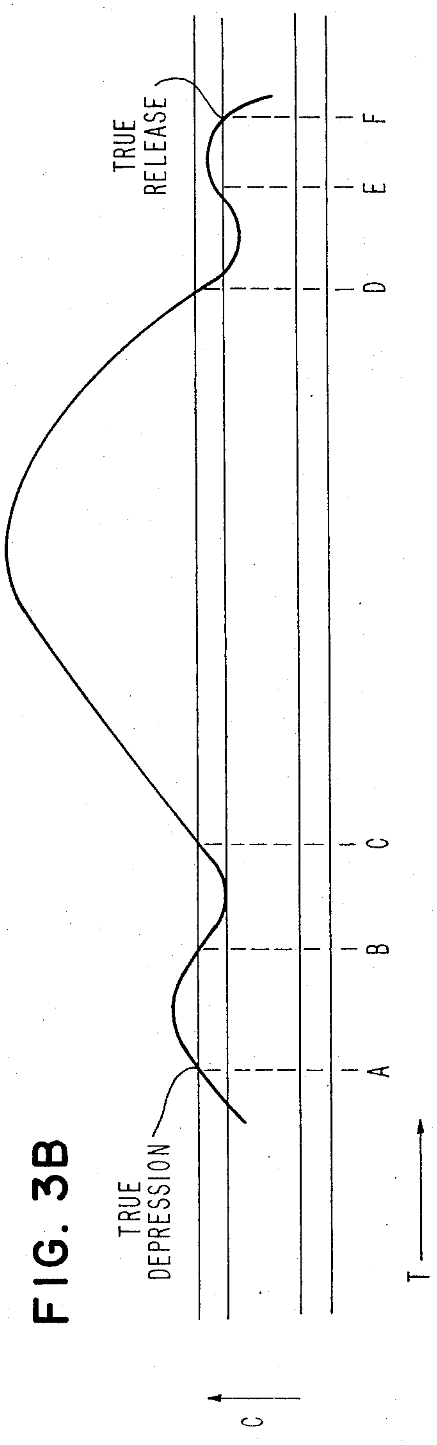
FIG. 3B illustrates a typical curve of varying capacitance for a capacitive key transducer during a depression and release cycle. It also illustrates the effects of signal fluctuation and the variable threshold technique of overcoming these effects.

As an example of the application of the foregoing double pulse and variable threshold sensing schemes, consider FIG. 3A and 3B: FIG. 3A illustrates on a chart of voltage output versus time the output of the sensing amplifier with and without the variable threshold feature in the sensing scheme and utilizing the double pulse detection scheme at the same time. Shown in dotted lines in FIG. 3A is a hypothetical voltage output which would be produced by the double pulse checking circuit of FIG. 2E. FIG. 3B illustrates in highly exaggerated form, a chart of the variable capacitance versus time during a typical key depression and key release cycle. Superimposed on FIG. 3B are the variable threshold levels T1 and T2. FIG. 3A is aligned above the appropriate portions of FIG. 3B to show the effect of sensing the level of coupling (or voltage) produced by the trace of varying capacitance during key depression and key release in FIG. 3B. As can be seen, on key depression, a capacitive coupling curve rises in a nearly linear fashion to a point, then because of circuit fluctuations or other causes, reverses itself slightly before continuing its general linear upward movement to its full coupling value. The curve then falls in essentially the reverse of its upward trace until it reaches virtually zero coupling. There exist two points within this typical depression and release curve at which, due to slight variations in the capacitive actuator mechanism, fluctuations in the power supply and variations in the sensing components, the sensing of more than one key depression may occur using the double pulse checking technique. As the rising capacitance crosses threshold 1 (point A), and two pulses from clock 3 are applied, a valid key depression signal would be given as illustrated in point A of FIG. 3A. However, if the capacitance coupling falls slightly, as at point B in FIG. 3B, the circuitry would not detect sufficient coupling and would interpret it as a release of the key. The double pulses would not match and output of the amplifier would be dropped, as in FIG. 3A at point B, only to be raised again at point C when the coupling again rises above threshold 1 as shown in FIG. 3B. This slight variation in the capacitive coupling curve produced by variations in the actuators and sensing circuit components can also lead to improper sensing during key release as illustrated at points D, E, and F in the figures. The result is, that without the variable threshold feature, as many as three key depression output signals could be produced by the amplifier using the double pulse checking scheme even though only a single key depression and release occurs. As illustrated in FIG. 3B, by the addition of the lower threshold T2 to the B pulse as described above, once a valid depression has been sensed in the double pulse checking routine, a true release of the key will not be detected until the sensing circuitry fails to find threshold T2 to be satisfied at point F.

In summary, then, the double pulse checking technique is used to discover valid key depressions and, it is coupled with the variable threshold technique to determine when a valid key release has occurred in spite of the variations in signals which may be produced and sensed in the amplifiers. It should be understood that the capacitance versus time curve in FIG. 3B has been shown in a highly exaggerated form with relationship to its variations and the various threshold levels illustrated in order to clarify this point while actual variations experienced in operation may be of much shorter duration and harder to define, the figures illustrate the general theory behind the operation of these circuits.

Turning now to FIG. 4, the gated low impedance integrating sensing amplifiers 2 are illustrated in greater detail together with the gating circuitry and with a stylized logic diagram for the threshold varying details of FIG. 2D. The commonality between portions of FIG. 4 and FIG. 2D is indicated by common numbering for the components with amplifier 15 from FIG. 2D represented therein in its stylized version which includes both stages of amplification illustrated in FIG. 4. The threshold varying circuit of FIG. 2D is illustrated in block logic schematic form in FIG. 4 where the plus amp gate and minus amp reset signals from clock 3 are shown being applied to final output AND gates to allow the final signal from the detecting amplifier to be outputted on line 19 for input to the double pulse checking circuitry of FIG. 2E.

In general, the amplifier 15 in FIG. 4 follows the teachings of application Ser. No. 203,390, now defensive publication T904,008 in that it is a low impedance integrating current amplifier, but a second stage of amplification is included to convert the voltage output signals from the first stage of the amplifier to sufficient current levels to be useful. As illustrated on the inputs of the amplifier first stages, open collector AND gate 27 receives the output of high order bits 0 and 1 from address generator 6 in FIG. 1. The property of the open collector AND gate 27 is such that the input to each amplifier stage is grounded unless the bit 0 and bit 1 conditions are met as indicated in FIG. 4.

Placing the gating for the amplifiers at their inputs serves the dual purpose of reducing the number of pin connections required and also reduces the number of components greatly in that separate variable threshold and gating circuits such as illustrated in FIG. 2D are not required for each separate amplifier but can be commonly shared by all amplifiers as illustrated in FIG. 4. A separate row from capacitive matrix 1 is shown connected to the input of each row amplifier (designated arbitrarily in FIG. 4 as row 1 through 4).

Until now, this specification has centered around the sensing of pulses which have been supplied to the appropriate row or column of a capacitive key matrix and has been assumed that some means of applying these pulses and for gating signals would be discussed in greater detail. Returning now to FIG. 1, the drive decoder and sense decoder, 8 and 9 respectively, provide the aforementioned functions of gating the amplifiers and of applying pulses from clock 3 to the appropriate column in the capacitive key matrix. These decoders 8 and 9 may take the form of the well known diode decode circuits which convert a binary input on a plurality of leads into a single output on one of several leads. Such devices are well-known in the art and include, as equivalents, combinations of AND and OR logic gating circuits to provide the same result in which the binary number or a portion thereof decoded from an input on multiple lines to provide an output on only one uniquely identified line. The sense decoder 9 provides the additional function, besides the gating of amplifier 2, of decoding special bits in the address code coming from address generator 6 which identify the function and shift keys and the special or typamatic control previously alluded to under the general specification description. The functioning of drive decoder 8 and sense decoder 9 and the construction thereof are the same as other typical binary to single output decoders and will not be discussed further herein. The operation of these decoders depends, of course, upon the receipt of a generated binary address from address generator 6 which is controlled by the address generator control 5 and modified by the branch and jumper controls 7. It is the purpose of the following discussion to clairy and discuss the construction and operation of these latter elements.

Address generator 6 may be, as alluded to earlier, a simple binary counter which is incremented one bit at time by signals from clock 3 to provide a unique binary number or address at its output. This binary address can be decoded in drive and sense decoders 8 and 9 to provide the drive and gating signals for the capacitive matrix and the unique binary address itself can be used as the data output for the keys thus identified. This approach, however, requires careful hand wiring of specific rows and columns to the desired decoder outputs and, of course, extensive rewiring is necessary to change the "personality" of the keyboard in which the depression of the given key can cause a different code output, (i.e., a different address code can be used to identify the key instead of the one normally used). Other difficulties with the use of the ordinary binary counter and decoder operation lie in the lack of flexibility with which the system can be adapted to provide other modes of operation for special functions keys and controls.

A somewhat more complex embodiment of an address generator which is highly flexible in its control and in its branch and jumping capability can be built based upon the use of a read-only storage (or ROS) device such as is commonly known today. These devices generally consist of an integrated circuit transistorized memory which is fabricated to store data at the particular points in the memory and cannot thereafter be changed. Such devices generally are based on one of the now standard transistor technologies, such as FET's, and may be purchased in a variety of bit capacities from a number of manufactures. The particular ROS utilized in an embodiment of this invention, the method of utilizing it as an address generator, and of providing the branch and jumping controls will be discussed in some detail.

An inherent limitation in the straight binary counter address generator is that it only generates specific addresses in a fixed order or sequence. This means, that in the case of keys in a matrix on a keyboard, which may be physically arranged in a specific order for ease in typing or entering data, that either special wires will have to be connected to successive positions on the address decoder in order to reach keys which are not in sequence in the matrix, or some type of permuted generation order or scheme must be developed in order to access keys in the desired pattern yet which will be addressed sequentially by the address generator. Each of these keys must be accessed at least once during some minimum time period during which the entire keyboard is scanned, but certain of these keys must be accessed first in order to provide control for any following key accesses. An example of this type of operation would be that of the shift key or repeat key. The shift keys status must be known in order to provide correct data for any sequential key depression. A repeat key operation requires that the status of the repeat key be interrogated first so that sequential key depressions can be timed for pulsed outputs. Ease of implementation usually dictates a common reset for control key status (repeat and shift) and resetting up if the key is still depressed.

Also, at times, the data associated with the key must be changed in order to conform to the using system which is connected at the interface of the keyboard, that is, there may be a need to convert the output character code from EBCDIC to ASCII or from one or the other of these to binary, or the coding for many characters may have to be changed entirely. A simple binary counter which outputs a binary address simply does not meet these needs easily without the use of a separate addressable storage means which can utilize the binary address to access storage locations and output the desired data. Such approaches have been utilized in the prior art, but a major limitation of this approach is that the specific storage means addressed by the binary code is itself an expensive item which must either be changed, reloaded, or replaced entirely if any change in the output character code other than the one associated with a specific binary address is provided or, alternatively, the storage device must be of a large enough size to store all possible output codes that would be desired. Both of these alternatives are economically unfavorable at present and also lack the flexibility of utilizing a read-only storage device as an address generator in place of the usual binary counter or similar means.

A ROS can be used in a self-addressing mode in which the output from the ROS is utilized to address another location in the ROS. Such self-addressing of the ROS can be interrupted for an interim branching technique to another location with in the ROS. The method of implementing these functions and applying them to the address generator 6 are provided as follows: Referring to FIG. 5, the basic flow diagram of a self-addressing ROS as illustrated. The major components of this subsystem are the clock 3, which is a segment of the major clock 3 of FIG. 1, which provides basic timing pulses. Additionally, there is an address control 5, which is utilized under the control of a branch signal to select alternate data busses from the ROS 28. An input register bank 29 is utilized to hold the input address stable for a time until that address within ROS 28 can be accessed. Output register 30 holds the output data stable until it can be utilized as will be described.

As to clock 3, the general requirement is that the clock must provide for this embodiment at least two discrete and non-coincident pulses during its cycle. An ordinary multivibrator with appropriate gating and latches is utilized for this purpose. Of the two pulses provided by clock 3, pulse 1 is used to gate the output of the address control 5 into the input register 29. The second pulse from clock 3 is utilized to gate the output of ROS 28 into output register 30. Each pulse must occur at least once during a defined "work" cycle for ROS 28. This work cycle and the operation of the ROS will become clear below.

Address control 5 has the function of deciphering from a stimulus or code provided, whether the output from either the address feedback bus 31 or the data control bus 32 is desired. Substitution of the data control bus 32 either in part or in whole for the address feedback bus 31 is utilized during an interrupt cycle to the normal self-addressing operation of the ROS as will be described.

Input register 29 is used to store, during the first pulse from clock 3, whatever the output from the address control 5 is at that time and to hold it stable for the duration of the ROS access cycle.

Output register 30 is loaded during pulse 2 from clock 3 and remains stable for sampling by the external using system as the final output data.

In general, variations are permissible in utilizing the standard logic implementation of self-addressing ROS without departing from the basic teaching herein. For instance, no real difference in the resultant effect would be brought about by implementing the output register in the form of edge sensitive devices (triggers) instead of utilizing a storage register and by removing the input registers and sending in the input address directly. Likewise, edge sensitive devices could be used in place of input register 29 to allow the removal of the output register. The address control 5 itself could be removed if address substitution is not a desired alternative. In such a case, output register 30 could be connected directly to the input register to provide the input address for the next cycle of operation of the ROS. The above-noted implementation using edge sensitive devices instead of registers could also be used with the address control 5 removed.

The general principle of operation of a self-addressing ROS in a keyboard embodiment is as follows: For purposes of this discussion, a ROS of 128, 20-bit bytes is utilized, but the ROS size is not limited by these particular dimensions and any particular size available could be utilized or paired, etc., if available size is not sufficient. For the 20-bit byte size of the present ROS, it is assumed that the 20 bits of storage in a byte will be utilized as follows: Bits 0 through 6 represent, in binary code, the address of a specific keyboard key which is to be accessed. Bits 7 through 15 represent the data bits which will be outputted as being associated with that specific key defined by bits 0 through 6; bits 16 through 19 are control bits for defining special functions as will be discussed. It is further assumed that the number of keys to be accessed is a standard 64. However, this is not a limiting factor and the operation of the system is identical for a larger size keyboard and requires only an increase in size in the ROS.

At the time power is initially applied to the system, some address, which will be the first address of a key to be accessed, must be stored in a register 29. It is not particularly important which address is used for this purpose but it does define the starting point in the cycle of address and data generation and it is assumed for purposes of this discussion that the initial address is 0 (bits 0 through 6 are all 0). This address will be presented to the input register 29 from address control 5. At the arrival of the first pulse 1 from clock 3, this address 0 is moved into input register 29 which causes position 0 of ROS 28 to be accessed through appropriate accessing decode circuitry which is, for clarity, not illustrated but is provided with the ROS device. At the arrival of pulse 2 from clock 3, the information content (in this instance, a new address) of that portion of the ROS defined by the address 0 is moved to the output register 30. Any key address from 1–63 could be associated with the 0 address position of the ROS just defined and its address would be the data associated with the 0 position in the ROS. This key adress would be moved to output register 30 along with the data bits and control bits associated with that address. The using circuitry, in this case the drive and address decoders 8 and 9, utilize the first bits (0 through 6) appearing in output register 30 to gate driving pulses from clock 3 to a specific column in key matrix 1 and to gate a particular amplifier for a row within amplifiers 2 to pass signals through. The particular key thus defined is thus accessed and, if it is depressed, appropriate activity described previously under the pulse sensing operation will occur which will lead to the output of the data bit portion of the material now stored in register 30. This is the end of a so-called "work" cycle and is graphically illustrated in FIG. 6A.

At any time during the work cycle depicted in FIG. 6A, pulse number 1 from clock 3 can be applied to move the key address then appearing in the address control 5 into the input register 29 which will then access the position thus defined in ROS 28. At the end of the work cycle, defined initially by the occurrence of pulse 1, pulse 2 is provided to read out the ROS information content appearing at the accessed location into the output register 30. As previously indicated, any new key address not previously accessed can be stored at this location in the ROS for read out into the register 30, thus ending the particular work cycle for the ROS. The next work cycle begins with the next pulse 1 occurring and ends with succeeding pulse 2. The same cyclic sequence of events continues until each key has been accessed once, in whatever particular order the key addresses have been stored within the ROS. The last key accessed during a scan of the ROS would have associated with it the 0 address which was utilized to begin the scan and that 0 address would appear in address control 5 over the address feedback bus 31, under normal operation of the ROS self-addressing function, to be stored in the address control for input at the next pulse 1 to input register 29, when a new scan will begin. A complete scanning loop is thus closed. It may be seen that the order in which addresses are generated is fixed by the order in which they are stored in the ROS, but that they need not follow any strict numerical sequence such as with a binary counter. At times, however, it is necessary to interrupt even this cyclical flow of address generation to utilize alternate input data to address another portion of the ROS.

As was stated earlier, it becomes necessary at times to modify the data associated with a particular key. This particular operation is accomplished by address control 5 by utilizing one of the control bits 16 through 19 associated with the key and stored in the ROS together with the data bits normally used for that key. These special control bits can be used to identify alternate data keys. When this special bit is encountered by address control 5, the data bit portion on data control bus 32 is moved to the output of address control 5 instead of the address feedback information appearing on address feedback bus 31. This substitution of addressing data in the address control 5 is arbitrarily chosen to be a number greater than 64 so that the upper half of the 128 byte ROS which was not utilized with the original 64-key keyboard layout assumption can be addressed. In effect, the appearance of one of the special control bits is utilized to address a whole new section of the ROS in which new data is stored as defined in the ROS as originally constructed. At this point, an extra pulse 1 and pulse 2 are also generated so that the new data thus accessed can be moved to the output register 30. This new data appearing in output register 30 contains the key address for the next key and the data control bits for the next key which normally would have been at the original key address before the substitution of addresses in address control 5, but the specific data bits are new. Following pulse 2, the key address for the next ROS location appears over the address feedback bus 31 into address control 5. The key address which is thus provided for the next access cycle may be the same as that which would have been provided in the old key address location (which would have been accessed were it not for the address substitution) and it allows a return to the generation loop defined earlier when the next pulse 1 and pulse 2 are provided. Thus, the appearance of a particular data bit in the control bits for a key which has been addressed in the lower portion of the ROS can be utilized to re-address another portion in the upper half of the ROS and provide different data for that key without departing from the ordinary cycle of address generation for the remaining keys.

Other alternate data for the particular key in which the control bit has been found on could be obtained by external stimulus to address control 5 as indicated by branch 33 in FIG. 5. When the special control bit is found on and the output on the data bus 32 is substituted for the output of the address feedback bus 31, all except the low order bit are substituted and the low order bit is provided in an on or off condition depending on the branch stimulus 33 illustrated in FIG. 5. If the branch stimulus is present, then the address bit for the low order position is on and the "branched to" address is modified by this single bit which is set by the level appearing on the branch 33 in FIG. 5. If this branch is at an inactive level, then the "branched to" address will be that which is contained in the data field (minus the low order bit) and will cause the generation, through the accessing of that address in the ROS, of a particular set of bits in the data control bit portion in the output register 30. An active level on the branch will cause the data field to be modified by one bit, a new address will be accessed in the ROS, and a new set of data bits will be obtained. After each branching operation, the key address portion for the next cycle is the same as it would have been for branch since the new address portion provided is the same as that which would have been stored in the old address which would have been accessed and the basic loop is thus returned to. Branching outward from the basic generation loop is not limited to the number of occurrences, but is limited by the size of the ROS used. Immediate return to the basic generation loop is not necessary since, by changing the key address which is outputted from the ROS at the "branched to" address, a second loop could be entered with a different random pattern of key addresses and data. This could continue, limited only by the maximum ROS size available, until a final branch return to the primary generation loop was undertaken. Branching to more than one of two different locations can be accomplished by providing more external branch stimuli (and by deleting more low order bits for use by external stimuli) to the address control 5 and by substituting these for the appropriate data bits in the address control section to allow a branch to one of N positions.

The basic advantages of the foregoing self-addressing generation scheme based on the use of a ROS are that it eliminates the requirement of having special logic for scanning the ROS, such as a binary address generator, it gives the capability for handling a number of code sets by utilizing the same code positions for those that are common among various code sets and by branching for those that are different, and it allows a predetermined sampling order for the keys which is independent of any fixed binary count or sequence with a minimum of hardware.

FIG. 6B illustrates how alternate data is obtained from a key as discussed above with the data bus bits being loaded into the input register because the control bit is found on followed by the branch bit being set on in the low order bit position discussed. FIG. 6C illustrates how a second loop can be entered as discussed above.

With reference to FIGS. 6A, B, and C, the following sequence of events is depicted. Pulses 1 and 2 control the gating in and out of the ROS. The particular address information is shown beside the heading "Address Control" and the feedback, or output, over the address feedback bus 31 is also listed. The contents of the input register, as controlled by the control bit and the branch bit, vary as illustrated in FIGS. 6A–6C. It will be noticed that the output on the data bus can be varied as discussed above and the figures 6B and 6C illustrate these effects. The blanks in the "Data Bus" row of FIGS. 6B and 6C reflect the fact that, ordinarily, this data varies with each new key, but is only pertinent, for these figures, when the control bit and branch control are being used. Therefore, this row is left blank, for greater ease in reading, except when the contents of the data field associated with each new address is being used as described.

As illustrated in FIG. 6B, the appearance of the special control bit over the address feedback bus 31 to address control 5 causes the address control 5 to load the output appearing over the data control bus into the input register 29 instead of what appears over the address feedback bus 31. This will send the self-addressing function of the ROS outside of the normal address generation loop to a new address in another portion of the ROS: it is essentially a step of defining the address for a new register. In the new segment of the ROS thus identified, the data will be read out as illustrated in FIG. 6B for utilization by the using system. In the event that, for the specific key pressed which produced this result, it is desired to associate different data from that found in the normal primary loop or from that found at the new address which is branched to when the control bit is found on, the "branched to" address can be modified by external stimulus over branch line 33 in FIG. 5. This will have the effect, as illustrated in FIG. 6B of sending the addressing ROS to a new portion outside of the primary generation loop as illustrated when both the control bit and the branch bit are on in FIG. 6B. The appearance of the control bit being on without the branch bit also being on will send the ROS to a secondary loop to pick up whatever data is there, while the appearance of a branch bit being on at the same time as the control bit is encountered will cause the contents of the data bus to be read into the address control and from there into the input register, where it will be incremented by a binary amount determined by the branch bit being on. In the example illustrated in FIG. 6B, the content of the data bus is 68, but it is incremented to 69 when it is read into the input register. Thus, instead of addressing address location 68 in the secondary loop of generation in the upper half of the ROS where alternate data is stored from that which would have been accessed in the lower half of the ROS, an adjacent storage location 69 is accessed by the depression of the key when the branch bit is on. An example of the use to which this flexibility is commonly put will now be set forth to clarify the reasoning behind these requirements in providing such flexibility.

At times, keyboards have various sizes due to added keys or special functions, i.e., having a 66–key basic keyboard and then adding 12 program function keys for system control in certain environments, creating a 78–key keyboard. Since the basic keys (66) are identical, the same read-only store can be used, and it is only necessary to scan 66 keys on the 66–key keyboard. On the 78–key keyboard, the secondary loop is entered for the extra 12 keys (because of the branch bit being on) and then exited at the end of each sweep of the basic 66 keys.

As illustrated by FIG. 6C, it is not necessary to return to the primary loop of address generation once a secondary loop has been entered, since the content of the address feedback can be loaded into these higher ROS storage positions to provide the same sequence of generation that might be found in the primary loop — this serves, in other words, as an extension of the primary loop and might find applicability where one wishes to program a ROS with fixed storage for either a 66 or a 78–key keyboard. If this were the case, it would only be necessary to build a standardized ROS and to turn on the control bit in an address position, such as the 66—key address position, to branch to a higher location in store to reach addresses for keys 67 through 78 and then provide a loop back to the start in the primary loop. This concludes the discussion of the address generator controls block 5 of FIG. 1, the address generator itself 6, and the branch and jumper controls 7. A discussion of the unique system provided for implementing N key roll will now be undertaken.

Returning now to FIG. 1, and to the brief description of the N key roll buffers and controls alluded to early in this specification, a more detailed discussion of the N key roll buffer and control section 11 will be undertaken. The term "key roll" is well-known in the keyboard art and relates to the phenonoma often produced by human operators who depress a second key or a third key before the first and/or second keys pressed have been released. This produces a potential source of confusion and error in data output keyboards and requires either a mechanical interlock or some type of sophisticated blocking circuitry which prevents the output of data when more than one key is depressed as is well-known in the prior art. In the present invention, however, several keys may be depressed and held down in sequence and the codes will be outputted in the order in which the keys were depressed without interference or confusion of the data. Also, it is a function of the N key roll apparatus described to prevent multiple outputs of data from the same key when it is held depressed. The exception to this is in the nature of a typamatic key which, when it is held depressed for more than a minimum timeout period, will output multiple codes — it is in effect, a repeat key. These keys are identified by a special bit in the control portion of their address codes which is detected by the sense decoder 9 which signals the typamatic control 14 to override the N key roll buffer 11 and to cause the output of strobe signals from the strobe and double pulse control 10 in spite of the fact that the buffer already contains the key address.

Figure 7:
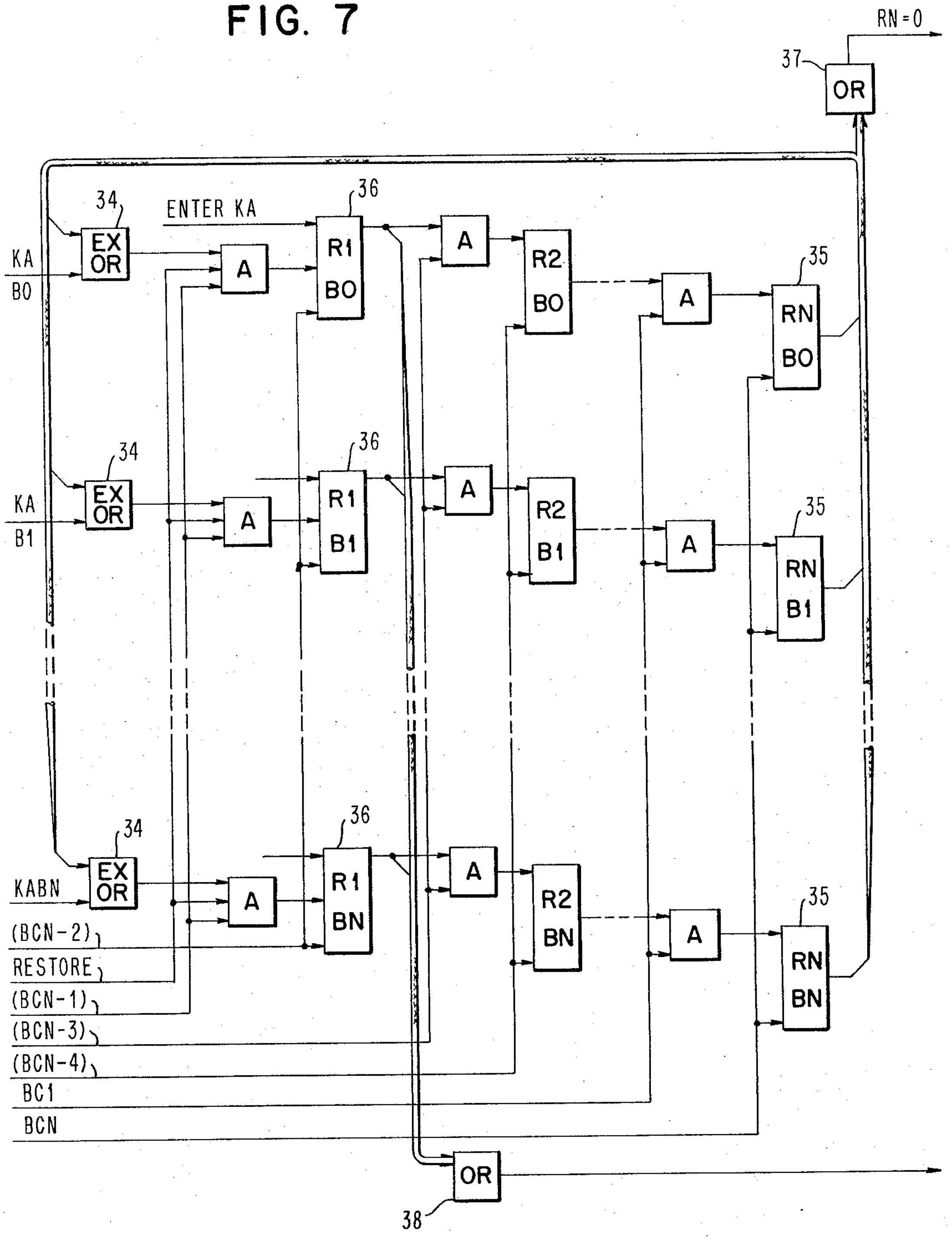
FIG. 7 illustrates, in schematic form, the circuitry used to provide N stages of keyroll.

The purpose of the buffers to be described now is to remember that a key has been depressed during the same scan period presently in progress so that only a single code output per key depression will be forwarded to the using system via the interface 4. The method of implementing these buffers has been selected as large scale integration semiconductor technology. The method of utilizing the buffers takes advantage of the longitudinal redundancy check (LRC) concept which provides for storage of the address of the key which has been depressed and also provides controls for the storage means. Turning to FIG. 7, the basic storage means for implementing the N key roll buffers is illustrated. A source of clock signals is also required, and these are provided from the basic clock 3 illustrated in FIG. 1. The storage means illustrated in FIG. 7 consist of a connected series of one byte storage registers, each of which is large enough to store the bits associated with the address of a given key. Enough registers are provided so that the "N" in the N key roll description number is as high as desired. Typically, three or four stages of register space are provided, with one of the registers being required for resyncing the data.

The source of basic clock signals 3 must output a three-part signal for the N key roll buffers and controls 11. These are a basic clock cycle, a register definition cycle, and a first and second half cycle signal. The basic clock signal requires that the number of clock pulses in the clock cycle be equal to two times the number of registers provided (this equates to one pulse for a set and one for a reset for each register). For each complete basic clock cycle, a register definition point must exist at which the contents of the registers is set. The number of register definition points will be one less than the number of registers provided, for a reason which will become clear below.

The half cycle signals must exist during the complete register definition signal and may, as outlined above, fall in either the first or second half cycle of the register definition period as defined by clock 3.

A complete key cycle consists of a first and second half cycle during which the address of the key being accessed will be stored so that it remains stable. Key addresses may be changed on the transition between the second half cycle to the first half definition.

Basic controls for the storage means illustrated in FIG. 7 consist of an Exclusive OR 34 of the input key address coming from address generator 6 together with contents of the $n^{th}$ byte register 35. The output of Exclusive OR 34 is connected to the input of the first byte register 36. Further controls include an OR 37 of all bits in the $n^{th}$ byte register 35, an OR 38 of all bits in the first byte register 36, a means for determining that a key is depressed or released (as has already been discussed with relationship to the strobe double pulse controls and gated amplifiers) and a means for remembering the status of the storage provided, (a threshold level for the registers).

As illustrated in FIG. 7, the implementation of the apparatus provides for four stages of key roll, (or N equals four). For a typical 127-key keyboard, the byte registers such as 35, 36, etc., must each contain 7 bits to define a binary address of sufficient size.

At each register definition point provided by clock 3, a byte of data is shifted from left to right by one register position. This requires the following sequence from the basic clock 3: BC1, set register contents of R3 into R4 (Rn where n equals 4 in this case); BC2, reset contents of R3 to 0 (off); BC3, set contents of R2 into R3; BC4, reset R2 to 0; BC5, set contents of R1 into R2; BC6, reset contents of R1 to 0; BC7, set the output from Exclusive OR 34 into R1; BC8, reset contents of R4 to 0.

The Exclusive OR 34 of the incoming key address from address generator 6 with the content of byte register 4 ($n$) is used to assist in determining the presence or absence of that particular presented key address in the storage means as it is configured at that point in time. If at any time the contents of R4 is identical to the key address which is provided from address generator 6, the output from Exclusive OR 34 will be 0, as will the contents of R1 once the output of Exclusive OR 34 has been loaded into it. The reason for this zero checking or Exclusive OR 34 will become clear below.

The OR functions 37 and 38 are provided for the following purposes. Exclusive OR 38 of all bits in R1 will produce an output if any of the bits in R1 are on. Similarly, Exclusive OR 37 will provide an output if any of the bits in R4 are on. If at any time during the first half definition period register 1 goes to a zero, at the BC8 point, Exclusive OR 38 will produce no otuput and it will have determined that the key address does in fact exist already in the storage means and this fact, 0 output from OR 38, will be remembered for the duration of the key cycle by storage status of a threshold device not illustrated in FIG. 7. If the output of Exclusive OR 38 is 0 at BC8 during the second half definition period, it is indicative that R1 in the storage means is available for use. If the key being accessed (the one whose address is now provided by address generator 6) is also depressed (as detected by the gated amplifiers 2 and the strobe and double pulse controls 10), that key address is entered into R1 at the BC8 point of the particular register definition period unless the threshold level of the storage status from Exclusive OR 38 indicates that the particular key address has already been stored as discussed above. If, however, the storage status is off, the using system will be notified at this time that a key has been sensed as depressed for the first time and the storage status is turned on for the duration of that key cycle to prevent multiple storing of this address.

The OR 37 of all bits in register 4 is used during the second half definition period. If R4 goes to 0 and the key whose address is presented at the input to R1 is not sensed as depressed, the Exclusive OR 34 input into R1 is blocked and R1 will be forced to a 0 at its reset time. This removes whatever key address is in R1 from the storage device.

In general, each key on the keyboard is accessed in turn with the address for that key being held stable for the duration of the key cycle. As the key is accessed through the drive and sense decoders 8 and 9, its status whether depressed or not depressed is interrogated as discussed at length above. If the status of that key has changed from the last time it was accessed, the storage means in FIG. 7 is updated to reflect the change, i.e., if the key had been previously stored and it is detected as depressed, its address is left in the buffers, if it it detected as not depressed but its address appears in the buffers, it will be removed from the buffer, if it is detected as depressed and its address is not in the buffer, its address will be entered into the buffer and, if it is not depressed and its address is not in the buffer, nothing is done. All of this will become clearer in the discussion which follows. For purposes of the following discussion, [(N1) (N2) (N3)] etc., nomenclature will be used in defining specific clock points during a key cycle. N1 equal 1 or 2 will denote the first or second half; N2 equal 1, 2, or 3 will denote register definition points, N3 equal 1 through 8 will denote the basic clock points. An X, if used, will denote all or any of the appropriate points in the key cycle.

Figure 8A:
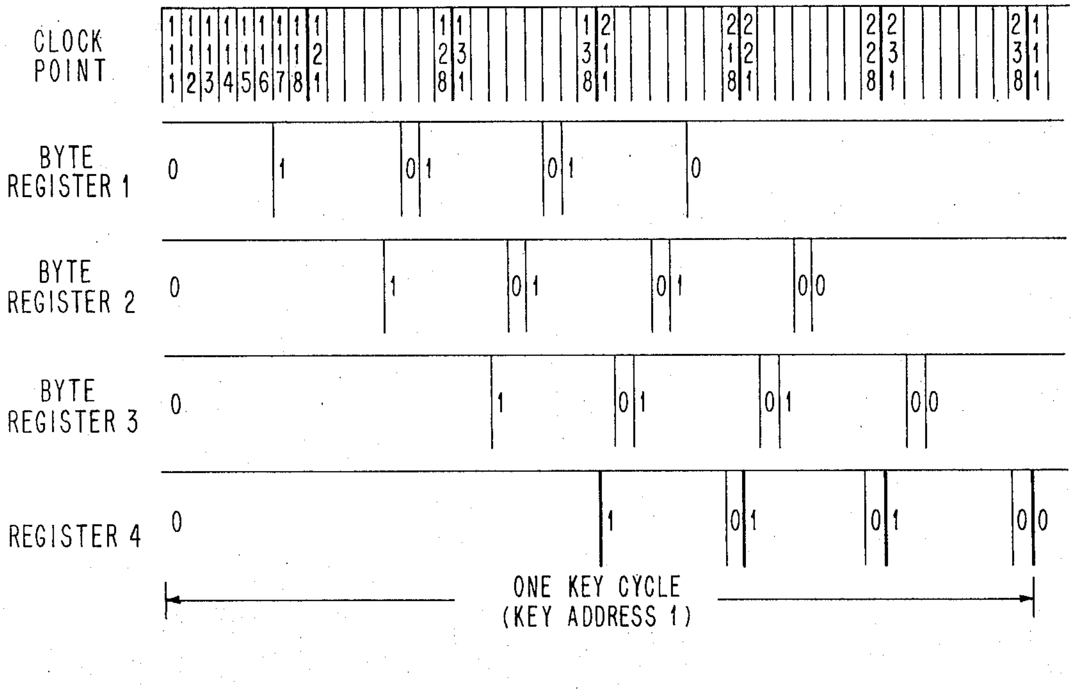
FIGS. 8A through 8G illustrate the various steps in operating the apparatus of FIG. 7.

Turning now to FIG. 8A, the condition in which no key address is already stored in the sections of the registers will be discussed. At the start of any key cycle, at which it happens that no key address is stored in the registers, the byte registers are all 0. This condition occurs at the power on reset signal which is produced in the general controls of the keyboard to reset all registers to 0 when the keyboard is first turned on. Assume now that key address 1 is being accessed at the start of a key cycle. The aforementioned shifting and Exclusive ORing of the contents of register 4 with this incoming address for key 1 will occur and be loaded into register 1. With continued shifting and Exclusive ORing, all registers would contain a 1 at the beginning of the second half definition period. As illustrated in FIG. 8A, register 1 is set to 1 at clock point 117 (identified as BC7 in the earlier discussions); R2 was set to 1 at clock point 125, R3 was set to a 1 at clock point 133, and R4 set to a 1 at clock point 211. As noted above, these designations 117, 125, 133, 211, etc., are a code which can be interpreted as follows. The first number, (N1), denotes whether the clock is in the first or second half definition period, the second number (N2), which can be a 1, 2, or 3, denotes the register definition points within these half cycles and the third number (N3), which can be a 1 through 8, denotes the basic clock period being produced by clock 3.

The address 1 is still presented to the input of Exclusive OR 34 in FIG. 7 and the Exclusive ORing will be performed again which will cause the contents of all the registers to be set back to 0 by the beginning of the next key cycle. As illustrated in FIG. 8A, R1 goes to 0 at clock point 216 and remains 0, R2 goes to 0 at clock point 224 and remains 0, R3 goes to 0 at clock point 232 and remains 0 and R4 goes to 0 at clock 111 and remains 0. This completes one key cycle as illustrated in FIG. 8A for the presentation of the key address 1. If key 1 had been detected as depressed, it would have been stored and held as will now be discussed.

Figure 8B:
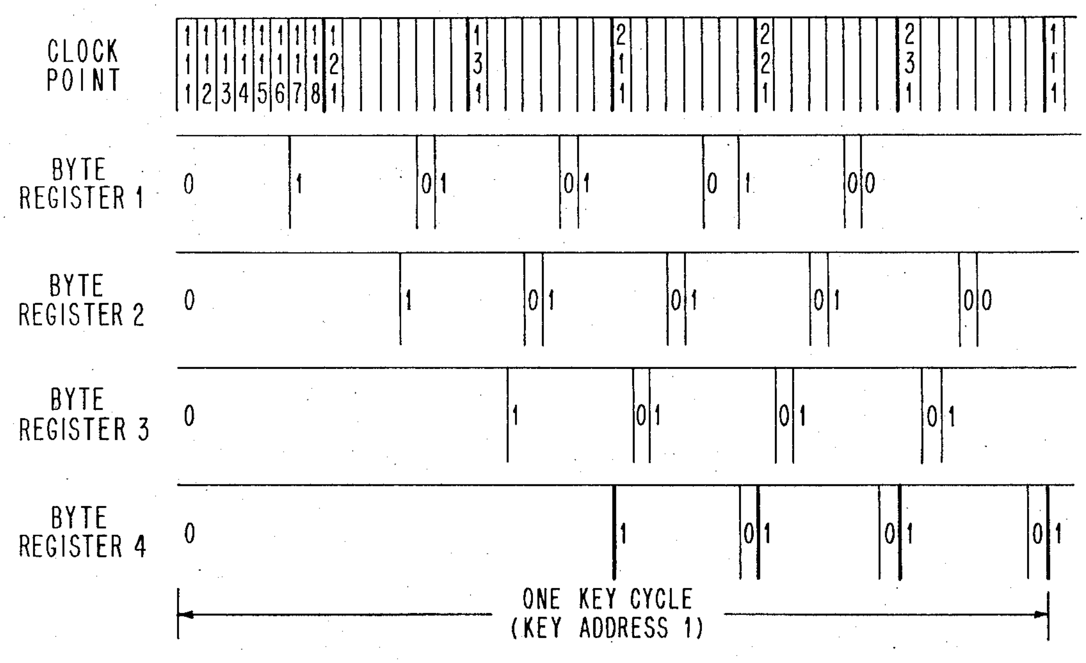

Turning to FIG. 8B, assume that key 1 was detected as depressed when its address was presented from the address generator 6. The operation during the first half of register definition cycle would be exactly the same as described above. However, at clock point 218, the OR 38 illustrated in FIG. 7 of the contents of R1 would indicate that the register R1 is empty and, since the key would be detected as depressed in this assumption, the address 1 would be entered into R1 and the threshold level of the storage status would be activated. At clock point 226 in FIG. 8B, register 1 goes to 0 and stays at 0. However, a chain of events has been begun as established by the fact that R1 had held a 1 for one register definition period longer than it would have if the key had not been detected as depressed. The chain of events which ensues is that each register will be held in a loaded condition for one additional register definition period with the result being that register 3 and 4 will contain a 1 at the beginning of the following key cycle.

The general operation can be seen to consist of two steps: during the first step or first half register definition period, the incoming address is checked against the contents of the registers to determine whether or not it is already present. During the second half, addresses which have not been detected as present in the registers and which are detected as being depressed keys are entered into the registers. The shifting and Exclusive ORing is such that, at the start of each new key cycle, the addresses of up to N previous depressed keys will be present in the registers for comparison against incoming addresses.

Figure 8C:
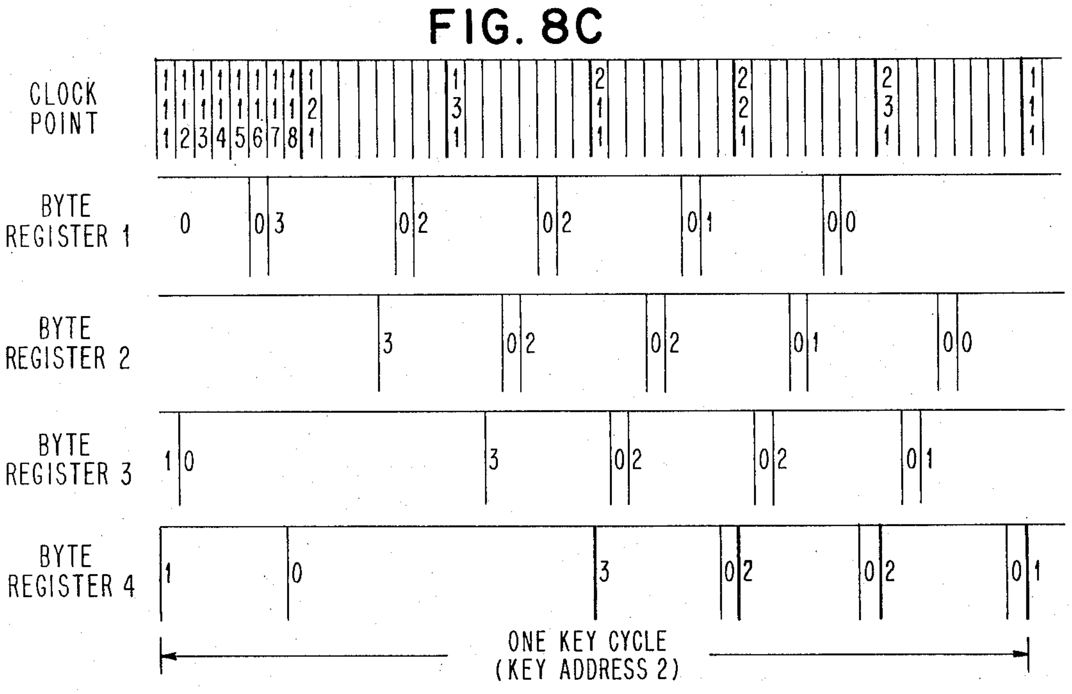

Continuing now with the description of the operation of the N key roll buffers, assume that a key address is stored and that no key depression occurs during the next key cycle. This condition is illustrated in FIG. 8C. Assume that the key address which occurs next is an address of 2. Since registers 3 and 4 contain a 1, as discussed above, the following occurs: at clock point 117, the Exclusive OR 34 of register 4 contents (now a 1) and an incoming address of 2 yields a result of 3 in register 1. At clock point 125, this 3 is moved to register 2. The process continues until the time all registers have been shifted to the right by one place and register 4 is at 0. At clock point 127, register 1 will go to 2 following the Exclusive OR with the contents of register 4 and will remain at 2 until clock point 211 when the status of the registers will be as follows: register 1 will contain a 2, register 2 will contain a 2, registers 3 and 4 contain a 3. At clock point 217 the Exclusive OR of the incoming address 2 and the contents of register 4 (now a 3) yield a 1 into register 1 and at clock point 227, register 1 goes to a 0 and remains 0 during the rest of the key cycle. Each of the registers will follow this sequence and at the end of the key cycle registers 1 and 2 will be 0 and registers 3 and 4 will contain a 1.

Figure 8D:
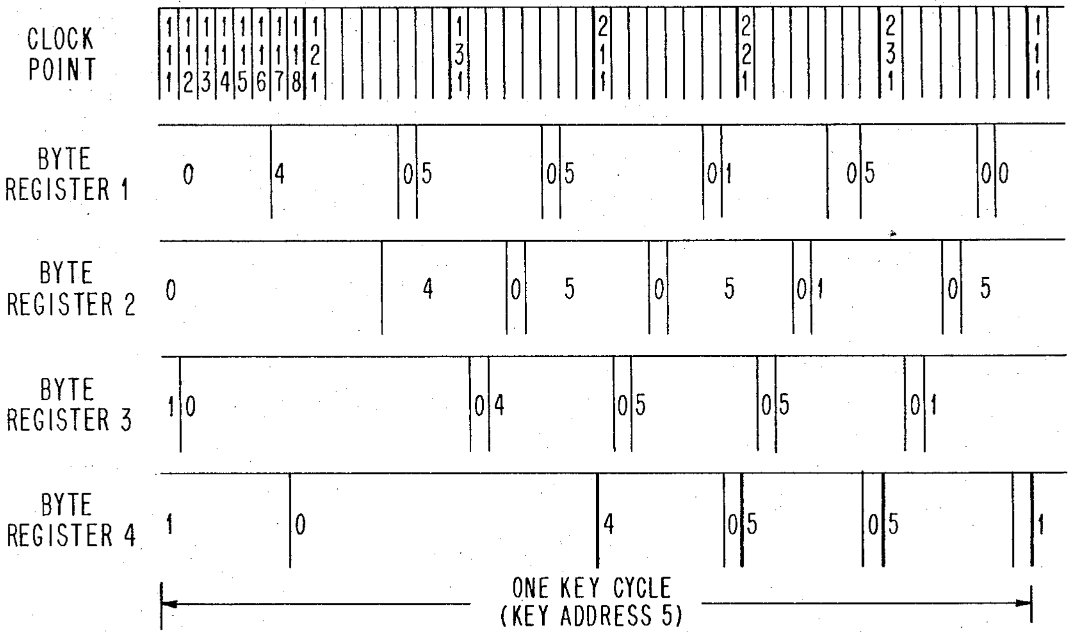
Figure 8E:
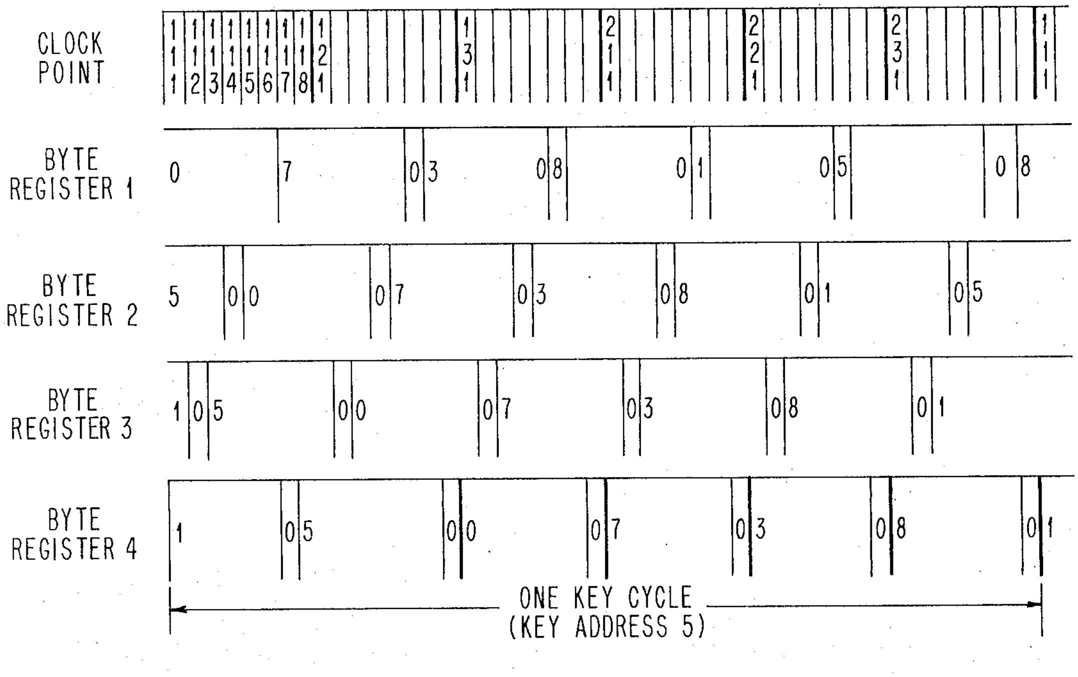

With reference to FIGS. 8D and 8E the storage of addresses for second and third keys which are detected as depressed, will be discussed. By following the rules outlined above, it can be seen that register 1 will not be 0 at clock point 8 until the second half cycle at clock point 228. At that time, whatever key is currently addressed can be entered if it is detected as depressed. For purposes of this discussion, assume that this key address is 5. At this piont in time, the using system will be told that the key is depressed and its coded output will be sent on and the storage status will be updated for that key cycle. At clock point 111 of the next key cycle, register 1 will be at 0, register 2 will contain a 5, and registers 3 and 4 will be 1. The third key detected as depressed is now assumed to have an address of 8. Again, register 1 is not at 0 during the basic clock pulse 8 until clock piont 238 is reached. At that time, key address 8 is entered into register 1. The system is again notified that a new key address is available for output and the storage status for that key cycle is updated. At clock point 111 of the succeeding key cycle, register 1 contains an 8, register 2 contains a 5, and registers 3 and 4 contain a 1.

Assuming now that a fourth key is depressed and none of the other three previously stored key have been released, register 1 will not be available as containing a 0 at the basic clock point 8 during the entire key cycle. No storage of the fourth key can thus take place and therefore, the using system will not be notified that a key has been detected as depressed and the code for the fourth key will not be outputted. Key accesses or key address codes can be generated at a much higher rate than human operators depress and release any key. This means that if any of the prior keys which were depressed are released, their storage allocation will become free, due to the shifting operation of the N key roll buffers previously discussed, and the fourth key will be, at the next time the address is generated, stored and signalled as depressed to the using system. Typical speeds of operation of the basic clock, the address generator, and normal operator depression and release times are such that each key can be addressed, compared against the contents of the buffers, and the appropriate storage and/or ourput signals given for that key within 8–16 milliseconds.

Figure 8F:
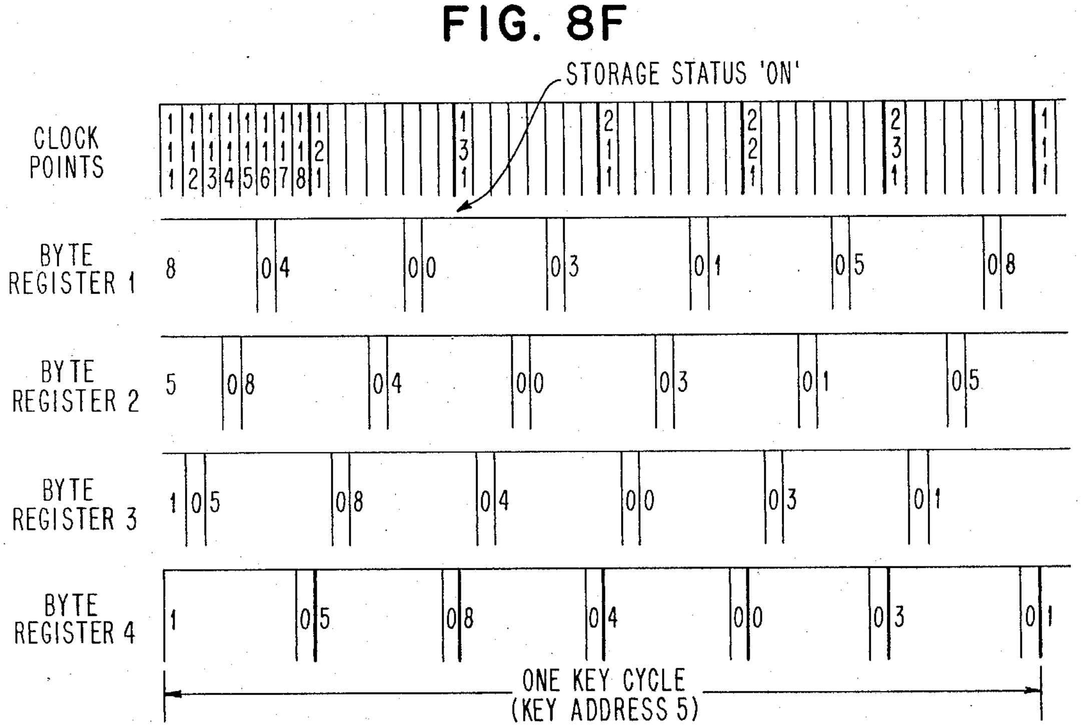

Circulation of the register contents with key addresses present (meaning that the addresses loaded have been addressed and discovered to be depressed) will now be discussed with relationship to FIG. 8F. Assume that as key 5 is addressed, it is determined to be depressed. Upon entering the key cycle, the registers have the contents as defined at the end of the preceeding discussion in that register 1 contains an 8, register 2 contains a 5, and registers 3 and 4 contain a 1. At clock point 116, Exclusive ORing of key 5 and the contents of register 4 yield a 4 into register 1. At clock point 126, register 4 contains a 5 and, as the key being addressed is 5, a 0 will be produced and entered into register 1. At this time, storage status can be turned on as this is done at clock point 128. At clock point 136, register 4 contains an 8, and therefore, following the Exclusive ORing, register 1 will be set to a 3. At the beginning of the second half cycle, clock point 211, register 1 will contain a 3, register 2 contains a 0, register 3 and 4 contain a 4. During the second half cycle at clock point 216, register 1 is restored to a 1 as the result of the Exclusive ORing between a 5 and a 4. At clock point 226, register 1 will be set to a 5 and at 236, register 1 will be set to an 8 because of the Exclusive ORing of the contents of register 4 (a 3) and key address 5. Entry into the next key cycle will find the contents of registers 1 through 4 in the same status as they were upon entry of the key cycle at which the address 5 was presented.

Figure 8G:
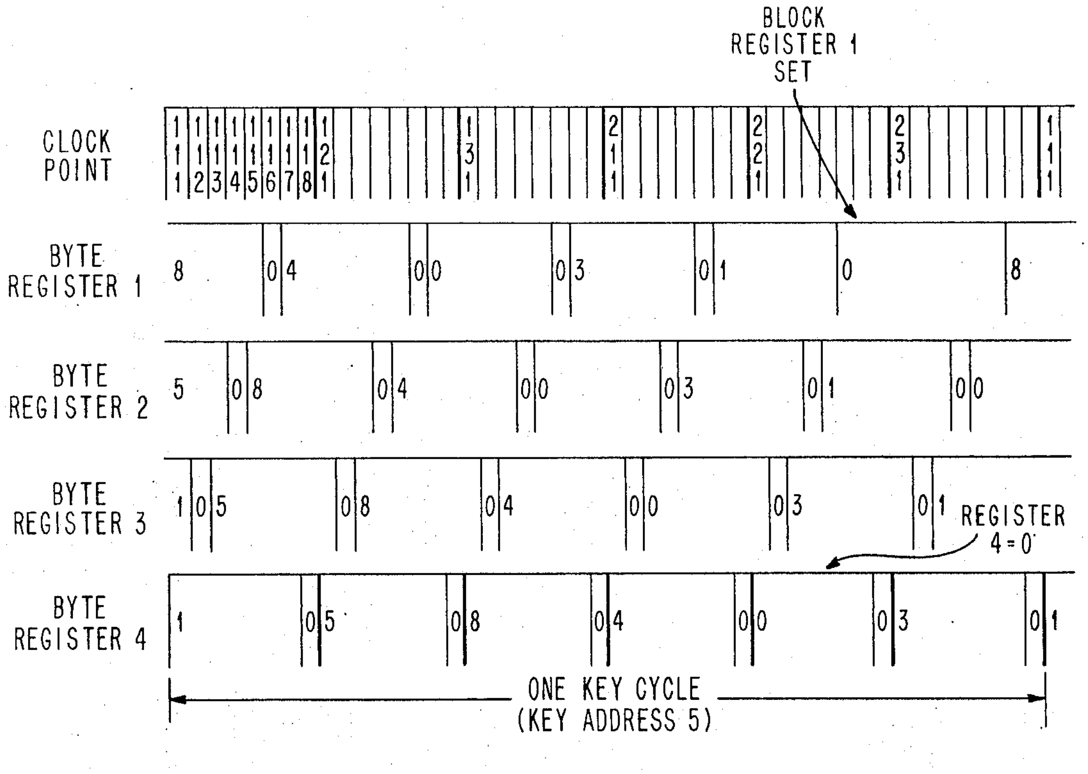

Assuming now that a key is addressed which is detected as not depressed, and whose address is already in the storage registers, attention is directed to FIG. 8G. Assuming that the key address in question is again address 5, it is assumed that the key is detected as released or not depressed. During the first half of the key cycle, up until clock point 226, operation is identical with the above discussion. However, at clock point 226, it is determined from the ORing of all of the bits in register 4, that register 4 is a 0. Since the key is released, the Exclusive OR of the contents of register 4 and the address 5 is blocked and register 1 will go to zero during this register definition cycle. Register 1 will be set to an 8 at clock point 236 and the contents of the registers at the beginning of the next key cycle will be as follows: Register 1 will contain an 8, register 2 will contain a 0, and registers 3 and 4 will contain a 1. If a fourth key had been depressed earlier, and held down until this piont in time, storage space is now available in the storage means and at the end of the key cycle during which the particular key in question has again been addressed, the address will be stored. As each of the keys detected as depressed is released, the allocated space in the storage registers will be cleared out as illustrated above until such time as all registers become empty.

While the invention has been particularly shown and described with reference to preferred embodiments thereof, it will be understood by those skilled in the art that various changes in form and details may be made therein without departing from the spirit and scope of the invention.

What is claimed is:

1. A keyboard system, comprising:

clock means for producing electrical signal pulses;

at least one input and at least one output conductor means for conducting said signal pulses;

at least one selectively actuable key means for coupling said pulses from said input conductor means to said output conductor means;

at least one selectively actuable detecting means for sensing the presence of said pulses on said output conductor means in response to an actuation of said key means;

coded address generating means for generating different multi-bit coded addresses;

decoder means connected to said address generating means for decoding said addresses to provide enabling signals for only one said input conductor means and only one said detecting means;

gate means responsive to said enabling signals and connected to said decoder means for the receipt of said enabling signals therefrom, and connected also to said clock means for the receipt of said pulses therefrom, for gating said pulses to said input conductor means and also being connected to said detecting means for selectively actuating said detecting means in response to said enabling signals; and output means connected to said detecting means and responsive to the detection of pulses thereby, for outputting digitally coded signals representative of the identity of said key means.

2. A keyboard system as described in claim 1, wherein:

said output means comprises gate means connected to said detecting means and to said address generating means for outputting said coded address generated by said means at the time said pulse signals are detected on said output conductor by said detecting means.

3. A keyboard system as described in claim 1, wherein said output means further comprises:

a readable-only storage means having coded data stored therein in association with said coded addresses generated by said generating means; and output controlling means for outputting said stored data associated with the particular said address generated by said address generating means at the time said pulse signals are detected on said output conductor by said detecting means.

4. A keyboard system as described in claim 1, wherein:

said coded address generating means comprises an addressable readable-only storage means having coded address locations therein, each said address location containing another said address in addition to said data;

an output storage means connected to said readable-only storage means for receipt of said address and said data from said readable-only storage means; and an access and data storage means connected to said output storage means for the receipt of said address and said data therefrom and responsive thereto for accessing said location defined in said readable-only storage means by said address.

5. A keyboard system as described in claim 4, wherein:

said access and data storing means further comprises a means responsive to a control bit appearing in said address to access a location in said readable-only storage means which is defined by said data from said output storage means instead of said address.

6. A keyboard system as described in claim 5, wherein said access and data storing means further comprises:

means connecting said access and data storing means to an external stimulus for providing a branch bit for modifying said data from said output storage means, thereby defining a new location in said readable-only storage means for accessing later.

7. A keyboard system as described in claim 1, further comprising:

checking means connected with said detecting means for determining whether signals detected by said detecting means are valid pulse signals.

8. A keyboard system as described in claim 7, wherein said checking means comprises:

a voltage threshold level sensing means for indicating that signals sensed exceed a voltage threshold level;

memory means connected to said sensing means and to said clock means for storing an indication that a first signal has been sensed in excess of said threshold coincident with a pulse from said clock; and comparison means connected to said memory means for determining whether, at the next pulse from said clock, another signal in excess of said threshold has been sensed, and output means connected to said comparison means for outputting a signal indicative that a comparison was found, thereby identifying the detection of valid pulse signals by said detecting means.

9. A keyboard system as described in claim 8, wherein said checking means further comprises:

a voltage threshold varying means connected to said voltage level threshold sensing means for lowering said threshold level whenever said comparison means indicates that valid pulses have been detected, thereby facilitating the identification of a true release of said key means by the dropping of voltage signals sensed below said lowered threshold.

10. A keyboard system, comprising:

clock means for producing electrical signal pulses;

at least one input and at least one output conductor means for conducting said signal pulses;

at least one selectively actuable key means for coupling said pulses from said input conductor means to said output conductor means;

at least one selectively actuable detecting means for sensing the presence of said pulses on said output conductor means in response to an actuation of said key means;

coded address generating means for generating different multi-bit coded addresses;

decoder means connected to said address generating means for decoding said addresses to provide enabling signals for only one said input conductor means and only one said detecting means;

gate means responsive to said enabling signals and connected to said decoder means for the receipt of said enabling signals therefrom, and connected also to said clock means for the receipt of said pulses therefrom, for gating said pulses to said input conductor means and also being connected to said detecting means for selectively activating said detecting means in response to said enabling signals;

checking means connected with said detecting means for determining whether signals detected by said detecting means are valid pulse signals; and output means connected to said detecting means and responsive to the detection of valid pulses thereby, for outputting digitally coded signals representative of the identity of said key means.

11. A keyboard system as described in claim 10, wherein:

said output means comprises gate means connected to said detecting means and to said address generating means for outputting said coded address generated by said means at the time said valid pulse signals are detected on said output conductor by said detecting means.

12. A keyboard system as described in claim 10, wherein said output means further comprises:

a readable-only storage means having coded data stored therein in association with said coded addresses generated by said generating means; and output controlling means for outputting said stored data associated with the particular said address generated by said address generating means at the time said pulse signals are detected on said output conductor by said detecting means.

13. A keyboard system comprising:

clock means for producing electrical signal pulses;

at least one input and at least one output conductor means for conducting said signal pulses;

at least one selectively actuable key means for coupling said pulses from said input conductor means to said output conductor means;

at least one selectively actuable detecting means for sensing the presence of said pulses on said output conductor means in response to an actuation of said key means;

coded address generating means for generating different multi-bit coded addresses;

decoder means connected to said address generating means for decoding said addresses to provide enabling signals for only one said input conductor means and only one said detecting means;

gate means responsive to said enabling signals and connected to said decoder means for the receipt of said enabling signals therefrom, and connected also to said clock means for the receipt of said pulses therefrom, for gating said pulses to said input conductor means and also being connected to said detecting means for selectively actuating said detecting means in response to said enabling signals;

means connected to said detecting means and to said address generating means for preventing erroneous data output when more than one said key is actuated at the same time, said means comprising a circulating storage device and controls for loading addresses produced by said address generating means into said device, said controls including means for comparing each address generated by said address generating means with the then existing contents of said storage device, and means for entering addresses from said address generating device into said storage device whenever an address is generated and a key is simultaneously detected as actuated, and said address is not then found in said storage device, and means for removing said address if it is found in said storage device and a key is not detected as activated, and further including means for inhibiting the output of data by the following output means if a key is sensed as activated when said address is generated and said address is then found in said storage device; and output means, connected to said detecting means and responsive to the detection of pulses thereby, for outputting digitally coded signals representative of the identity of said key means.

14. A method of individually scanning the crosspoints of an N column times M row matrix of electrical conductors by defining single rows and columns, comprising:

a first step of storing matrix address data indicative of specific row and column designations for each discrete location in said matrix in a non-destructively readable data storage means;

a second step of addressing any arbitrary storage location within said storage means to access said matrix address data stored therein;

a third step of reading out said data from said addressed location in said storage means;

a fourth step of decoding said read out address data to energize one column and one row in said matrix; and a fifth step of re-addressing said storage device at another location therein as defined by said data read out in said third step, followed by repeating said fourth and fifth steps in sequence and repeating the process as often as described until all the matrix locations have been scanned.

15. Matrix scanner apparatus for individually scanning the crosspoints of an N column times M row matrix of electrical conductors by energizing single row and column combination, comprising:

an address memory means for storing addresses of specific matrix locations, said memory means being non-destructing readable;

an address decoder means connected to said memory means for the receipt of addresses therefrom for decoding said address to energize one out of M and one out of N conductors in said matrix; and control means connected to said memory means for causing addresses stored therein to be read out and responsive thereto for causing an address in said memory identified by said read out address to be accessed for a succeeding readout operation.

16. A method of preventing erroneous data output from a keyboard when more than one key is activated at the same time, comprising:

generating addresses for keys in an array singly and in turn to access said keys;

decoding said addresses and applying electrical signals to each said key so accessed in turn;

comparing the address of a key so accessed against the contents of a memory device which holds the addresses of keys which have already been addressed and sensed as being activated;

storing the address of said key in said memory device if said key is detected as activated when addressed and if its address is not then found in said memory device, and then transmitting the data for said key;

removing the address of said key from said memory device when said key is addressed and is found to be not actuated if said address is then present in said memory device; and blocking the transmission of data for said key when it is sensed as being activated when it is addressed and its address is then found in said memory device.

* * * * *